(12) United States Patent
Tsuji

(10) Patent No.: US 9,350,299 B2
(45) Date of Patent: May 24, 2016

(54) POWER SUPPLY DEVICE FOR HIGH FREQUENCY POWER AMPLIFYING CIRCUIT AND HIGH FREQUENCY POWER AMPLIFYING APPARATUS

(71) Applicant: Murata Manufacturing Co., Ltd., Nagaokakyo-shi, Kyoto-fu (JP)

(72) Inventor: Hitoshi Tsuji, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 18 days.

(21) Appl. No.: 14/535,508

(22) Filed: Nov. 7, 2014

(65) Prior Publication Data

US 2015/0061778 A1  Mar. 5, 2015

Related U.S. Application Data

(63) Continuation of application No. PCT/JP2013/062323, filed on Apr. 26, 2013.

(30) Foreign Application Priority Data

May 8, 2012 (JP) ................................ 2012-106860

(51) Int. Cl.
    *H03F 3/04*    (2006.01)
    *H03F 1/02*    (2006.01)
    *H03F 3/24*    (2006.01)
    *H03F 3/193*   (2006.01)
    *H03F 3/21*    (2006.01)
    *H03F 3/195*   (2006.01)

(52) U.S. Cl.
    CPC .............. *H03F 1/0222* (2013.01); *H03F 1/025* (2013.01); *H03F 1/0227* (2013.01);
    (Continued)

(58) Field of Classification Search
    CPC ........................................................ H03F 3/04
    USPC ......................................... 330/136, 297, 127
    See application file for complete search history.

(56) References Cited

U.S. PATENT DOCUMENTS

6,285,251 B1 * 9/2001 Dent ................... H02M 3/1582
                                                         330/124 R (Continued)

FOREIGN PATENT DOCUMENTS

| JP | 2006-514472 A | 4/2006 |
| JP | 2007-097252 A | 4/2007 |
| JP | 2007-215158 A | 8/2007 |
| WO | 2010/044346 A1 | 4/2010 |

OTHER PUBLICATIONS

Official Communication issued in International Patent Application No. PCT/JP2013/062323, mailed on Aug. 6, 2013.

*Primary Examiner* — Patricia T Nguyen
(74) *Attorney, Agent, or Firm* — Keating & Bennett, LLP

(57) ABSTRACT

A high frequency power amplifying apparatus includes a power supply device for a high frequency power amplifying circuit, an RF signal processing circuit, and a high frequency power amplifying circuit. Bidirectional converters supplying and/or regenerating an electric charge are provided between an input section of an input voltage and an output section of an output voltage. A converter controlling circuit detects an envelope of an RF input signal, and sets and switches resonant frequencies and amplitudes of the bidirectional converters such that the output voltage follows an amplitude change of an envelope input signal. A delay time detecting circuit detects a delay time of the power supply device for a high frequency power amplifying circuit and makes an adjustment through a delay adjusting circuit.

20 Claims, 21 Drawing Sheets

(52) U.S. Cl.
CPC ............. *H03F 1/0261* (2013.01); *H03F 3/193* (2013.01); *H03F 3/195* (2013.01); *H03F 3/21* (2013.01); *H03F 3/245* (2013.01); *H03F 2200/102* (2013.01); *H03F 2200/451* (2013.01); *H03F 2200/507* (2013.01); *H03F 2200/511* (2013.01)

(56) References Cited

U.S. PATENT DOCUMENTS

| | | | |
|---|---|---|---|
| 7,778,045 B2 * | 8/2010 | Alexander | H02M 3/1582 363/124 |
| 2004/0037100 A1 * | 2/2004 | Orr | H02M 3/33576 363/131 |
| 2006/0028271 A1 | 2/2006 | Wilson | |
| 2008/0258831 A1 | 10/2008 | Kunihiro et al. | |
| 2010/0148723 A1 * | 6/2010 | Cook | G06K 7/0008 320/108 |
| 2011/0163822 A1 | 7/2011 | Yamanouchi et al. | |
| 2013/0039104 A1 * | 2/2013 | Sharma | H02M 1/10 363/123 |
| 2014/0159811 A1 * | 6/2014 | Chen | H03F 3/2171 330/251 |

* cited by examiner

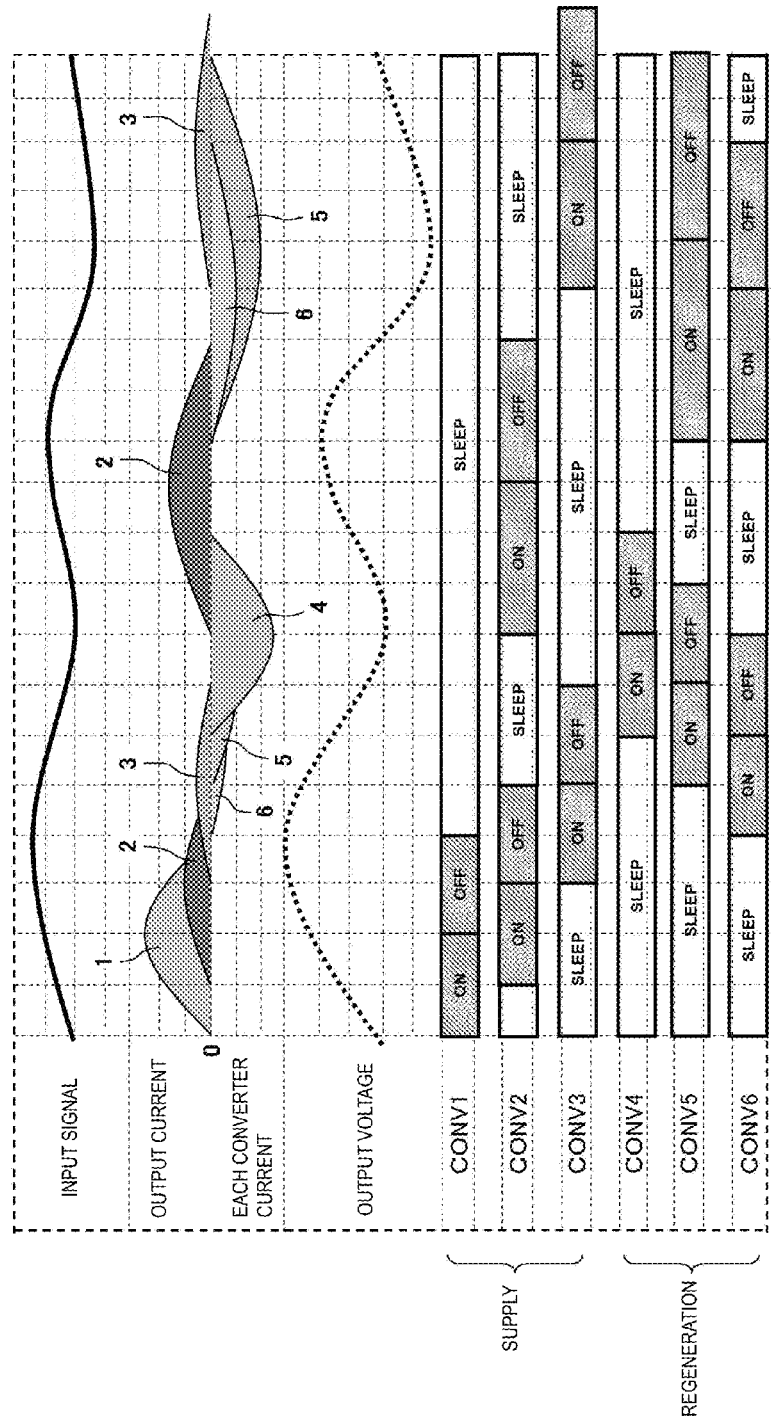

POWER SUPPLY DEVICE FOR HIGH FREQUENCY POWER AMPLIFYING CIRCUIT AND HIGH FREQUENCY POWER AMPLIFYING APPARATUS

BACKGROUND OF THE INVENTION

1. Field of the Invention

The present invention relates to power supply devices for high frequency power amplifying circuits. In particular, the present invention relates to a power supply device that enhances power efficiency of a high frequency power amplifying circuit and also relates to a high frequency power amplifying apparatus that includes such a power supply device.

2. Description of the Related Art

Japanese Unexamined Patent Application Publication No. 2006-514472 describes a configuration for enhancing the efficiency of a high frequency amplifying circuit, in which a power supply voltage of the high frequency amplifying circuit is made to follow an amplitude change (envelope) of a high frequency signal to be amplified. The frequency of the amplitude change of the high frequency signal in this case is not a carrier wave frequency (e.g., 1 GHz to 2 GHz in cellular phones) but is a frequency (approximately 10 MHz to 100 MHz at the maximum) of the amplitude change of the carrier wave. An example of a low frequency amplifying circuit is a class-D amplifying circuit (digital amplifier), but in a power supply device for a high frequency power amplifying circuit, a frequency band to be handled is high, and thus high speed switching is required.

FIG. 22 is a block diagram of a high frequency power amplifying circuit 50 described in Japanese Unexamined Patent Application Publication No. 2006-514472. The high frequency power amplifying circuit 50 illustrated in FIG. 22 includes an envelope detecting circuit 54, a supply voltage selecting circuit 56, a power supply voltage adjusting circuit 58, and a high frequency amplifying circuit 52. The envelope detecting circuit 54 detects an envelope of a high frequency signal (RFIN), and the supply voltage selecting circuit 56 selects a voltage source (V1 through V4) so that a power supply voltage follows the envelope of the high frequency signal (RFIN). The power supply voltage adjusting circuit 58 adjusts the waveform of the selected voltage and supplies the result to the high frequency amplifying circuit 52 as the power supply voltage. Through this, the high frequency amplifying circuit 52 amplifies the high frequency signal (RFIN) and outputs a high frequency signal (RFOUT).

The high frequency power amplifying apparatus described in Japanese Unexamined Patent Application Publication No. 2006-514472, however, employs a system in which a plurality of voltage sources are prepared and a voltage source is selected so as to cause the power supply voltage to follow the envelope of the high frequency signal. Therefore, a complex circuit and extremely complex control are required to repair a voltage difference (waveform steps) occurring when the plurality of voltage sources are switched. If this repair of the waveform steps is incomplete, distortion in the waveform increases, and an adjacent channel leakage power ratio (ACPR) in a communication system increases in turn, which negatively affects frequencies outside a stipulated range and consequently leads to a problem in that the high frequency power amplifying apparatus cannot be applied to a product having a strict permissible frequency band.

SUMMARY OF THE INVENTION

Preferred embodiments of the present invention solve the aforementioned problem of the complex circuit and control, and provide power supply devices for a high frequency power amplifying circuit and high frequency power amplifying apparatuses that enable a power supply voltage of a high frequency amplifying circuit to follow an envelope of a high frequency signal with a relatively simple configuration.

A power supply device for a high frequency power amplifying circuit according to a preferred embodiment of the present invention is configured to vary an output voltage supplied as a power supply voltage to the high frequency power amplifying circuit that amplifies a high frequency signal, in accordance with an amplitude change of the high frequency signal.

The power supply device includes a plurality of bidirectional converters provided between an input section of an input voltage and an output section of the output voltage. The bidirectional converters have a plurality of frequencies of resonant currents that flow through the bidirectional converters and are configured to supply and/or regenerate energy.

The power supply device further includes an output side energy storing element that is provided at the output section of the bidirectional converters, a time frequency analysis unit configured to convert an input signal of the high frequency power amplifying circuit to control information that includes frequency information and signal amplitude information on a time axis, and a converter controlling circuit configured to detect an amplitude change of the high frequency signal and to control resonant frequencies and amplitudes of the plurality of bidirectional converters such that the output voltage follows the amplitude change of the high frequency signal.

A high frequency power amplifying apparatus according to a preferred embodiment of the present invention includes a high frequency power amplifying circuit configured to amplify a high frequency signal, and a power supply device for the high frequency power amplifying circuit. The power supply device is configured to vary a power supply voltage supplied to the high frequency power amplifying circuit in accordance with an amplitude change of the high frequency signal.

The high frequency power amplifying apparatus includes a plurality of bidirectional converters provided between an input section of an input voltage and an output section of the output voltage. The bidirectional converters have a plurality of frequencies of resonant currents that flow through the bidirectional converters and are configured to supply and/or regenerate energy.

The high frequency power amplifying apparatus further includes an output side energy storing element that is provided at the output section of the bidirectional converters, a time frequency analysis unit configured to convert an input signal of the high frequency power amplifying circuit to control information that includes frequency information and signal amplitude information on a time axis, and a converter controlling circuit configured to detect an amplitude change of the high frequency signal and to control resonant frequencies and amplitudes of the plurality of bidirectional converters such that the output voltage follows the amplitude change of the high frequency signal.

According to various preferred embodiments of the present invention, the power supply voltage is varied in accordance with the amplitude of the input signal inputted to the high frequency power amplifying circuit, and thus an amplifier element of the high frequency power amplifying circuit is configured to be continuously operated in a condition close to a saturation point, which makes it possible to greatly reduce a loss that occurs in the amplifier element.

The bidirectional converters are configured to supply and/or regenerate energy, and thus carrying out non-linear control (pulse duration control, frequency control, combined control of a sleep time and a burst time) on the ON/OFF periods of an internal switching element in the bidirectional converters makes it possible to secure a greater dynamic range, which in turn enables high speed control. Consequently, irrespective of a range, namely from a low frequency to a high frequency, the amplitudes and the phases of a high frequency input signal and an output voltage are adjusted with high precision, and the output voltage is thus be made to follow the envelope of the high frequency input signal.

Each of the bidirectional converters is a resonant converter having a current resonant frequency, and thus energy corresponding to a half wave of a resonant current is supplied and/or regenerated. Thus, energy is supplied and regenerated with high efficiency.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 illustrates a state in which an output voltage is made to follow an input signal through the supply and/or regeneration of energy.

DETAILED DESCRIPTION OF THE PREFERRED EMBODIMENTS

First Preferred Embodiment

Figure 1:
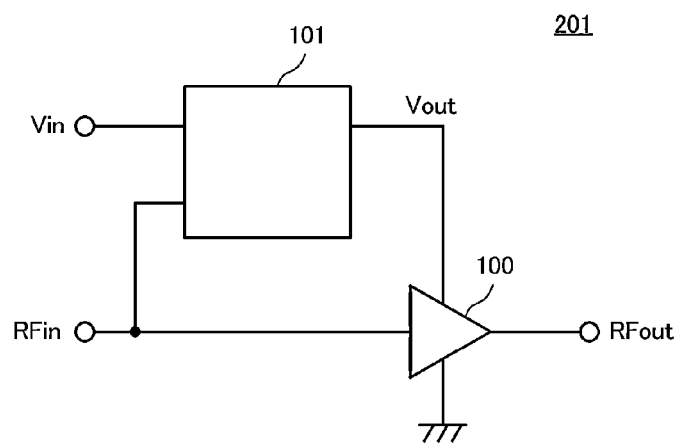
FIG. 1 illustrates a relationship among a power supply device 101 for a high frequency power amplifying circuit, a high frequency power amplifying apparatus 201, and a high frequency power amplifying circuit 100 according to a first preferred embodiment.

FIG. 1 illustrates a relationship among a power supply device 101 for a high frequency power amplifying circuit, a high frequency power amplifying apparatus 201, and a high frequency power amplifying circuit 100 according to a first preferred embodiment of the present invention.

The high frequency power amplifying circuit 100 receives a high frequency signal RFin as an input, amplifies the power thereof, and outputs a high frequency power signal RFout. The power supply device 101 for a high frequency power amplifying circuit receives an input power supply voltage Vin as an input, detects an amplitude change of the envelope of the high frequency signal RFin (an amplitude change of the envelope), and causes an output voltage Vout to vary so as to follow the detected amplitude change. The high frequency power amplifying circuit 100 operates with the output voltage Vout of the power supply device 101 for a high frequency power amplifying circuit serving as a power supply voltage thereof.

Figure 2A:
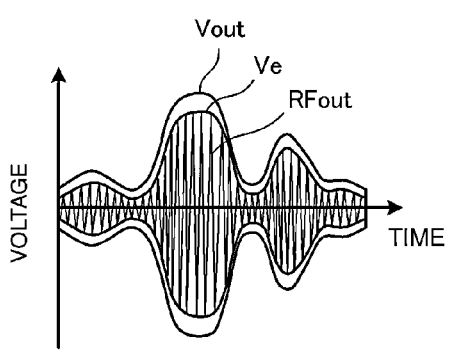
FIGS. 2A and 2B illustrate a relationship among a power supply voltage Vout of the high frequency power amplifying circuit 100, a high frequency power signal RFout, and an envelope Ve of the high frequency power signal RFout.
Figure 2B:
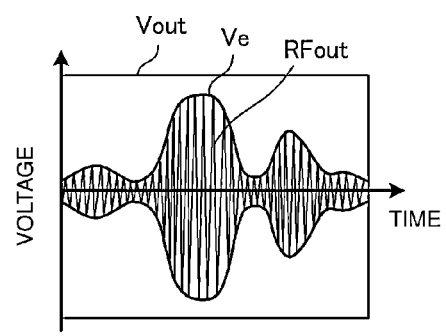

FIGS. 2A and 2B illustrate a relationship among the power supply voltage Vout of the high frequency power amplifying circuit 100, the high frequency power signal RFout, and an envelope Ve of the high frequency power signal RFout. FIG. 2A illustrates waveforms obtained when the power supply device 101 for a high frequency power amplifying circuit is put into operation, and FIG. 2B illustrates waveforms obtained when the power supply voltage of the high frequency power amplifying circuit 100 is kept constant. Here, for convenience when illustrating the envelope of the high frequency signal, the power supply voltage is also illustrated as being symmetric in positive and negative directions. Roughly speaking, the difference between Vout and Ve can be a loss. According to various preferred embodiments of the present invention, this loss is reduced or prevented.

Figure 3:
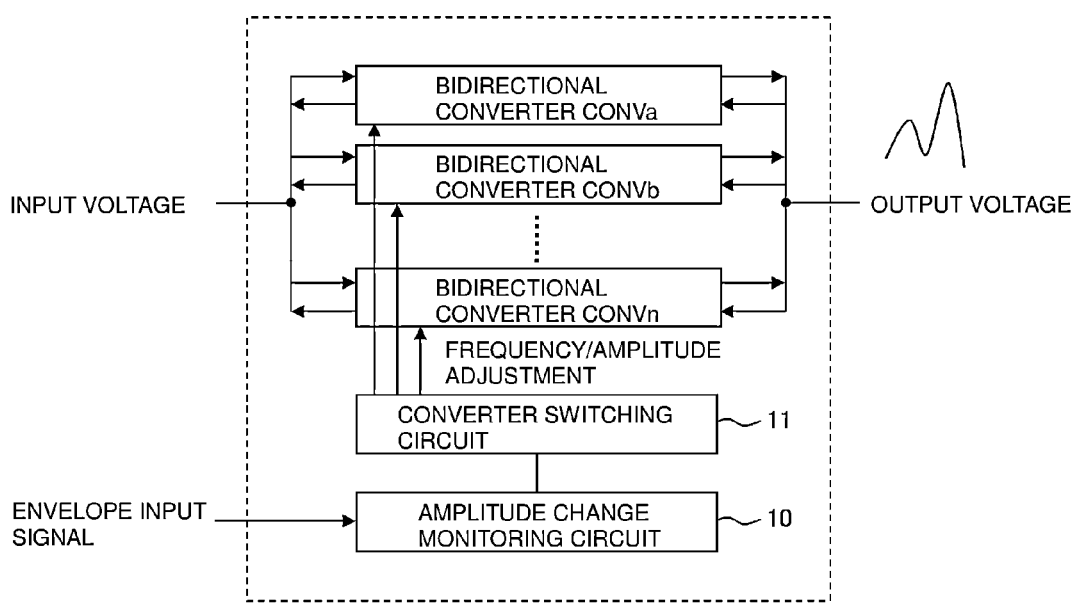
FIG. 3 is a block diagram illustrating a configuration of the power supply device 101 for a high frequency power amplifying circuit according to the first preferred embodiment of the present invention.

FIG. 3 is a block diagram illustrating a configuration of the power supply device 101 for a high frequency power amplifying circuit according to the first preferred embodiment of the present invention. A plurality of bidirectional converters CONVa, CONVb, ..., CONVn are provided between an input section of an input voltage and an output section of an output voltage. Each of these bidirectional converters is configured to supply and/or regenerate energy. Right and left arrows at the input and output sections indicate directions in which the energy is transferred. In FIG. 3, an "envelope input signal" is identical to a baseband modulation signal of a high frequency signal (1 to 2 GHz), and is identical to an envelope signal of the aforementioned high frequency signal. The envelope signal (envelope signal (maximum of 100 MHz)) is either supplied directly in a baseband or is obtained by detecting the envelope of the aforementioned high frequency signal. An amplitude change monitoring circuit 10 controls the supply and/or regeneration of energy in the bidirectional converters CONVa, CONVb, ..., CONVn such that the output voltage follows the amplitude change signal. A converter switching circuit 11 selects one of the plurality of bidirectional converters CONVa, CONVb, ..., CONVn so as to set a resonant frequency and an amplitude therein, and selectively drives the selected one of the bidirectional converters CONVa, CONVb, ..., CONVn. The amplitude change monitoring circuit 10 and the converter switching circuit 11 form a "converter controlling circuit" according to a preferred embodiment of the present invention.

Figure 4:
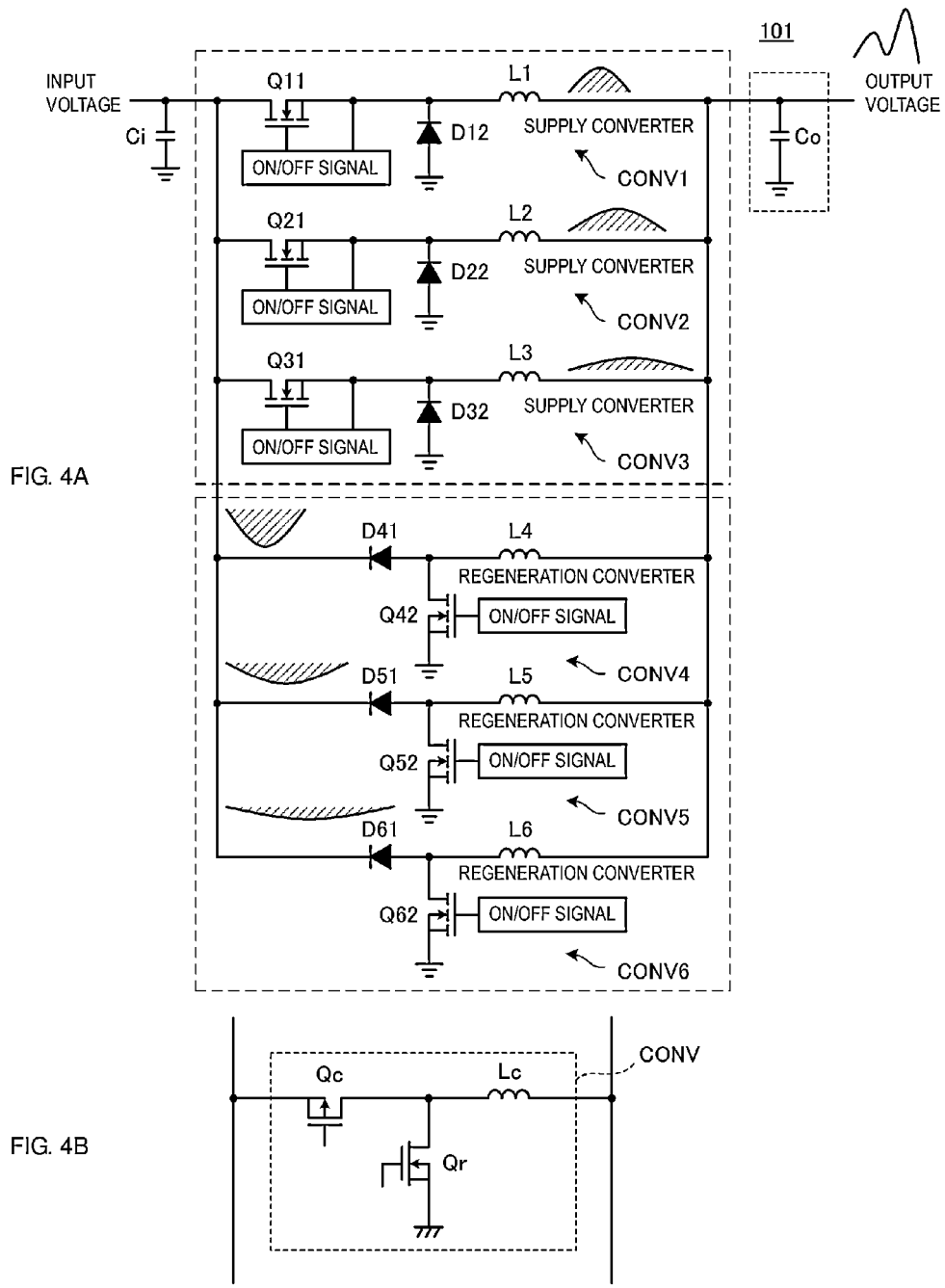
FIG. 4A illustrates the power supply device 101 for a high frequency power amplifying circuit and a detailed configuration of a bidirectional converter included in the power supply device 101.
FIG. 4B illustrates another exemplary configuration of a bidirectional converter.

FIG. 4A illustrates the power supply device 101 for a high frequency power amplifying circuit and a detailed configuration of a bidirectional converter included in the power supply device 101. In this power supply device 101 for a high frequency power amplifying circuit, converters CONV1, CONV2, and CONV3 are supply converters, and converters CONV4, CONV5, and CONV6 are regeneration converters. These converters collectively function as a bidirectional converter.

A capacitance Co that serves as an output side energy storing element and operates as a resonant capacitance is provided at an output section of the converters CONV1 through CONV6, and a capacitor Ci that serves as a regenerated energy storing element configured to store regenerated energy is provided at an input section.

The supply converter CONV1 includes a rectifying switching element (high side element) Q11, a switching controlling circuit that supplies an ON/OFF controlling signal to the rectifying element Q11, a commutating diode (low side element) D12, and an inductor L1. The supply converters CONV2 and CONV3 each have a configuration similar to that of the supply converter CONV1.

The regeneration converter CONV4 includes a rectifying diode D41, a commutating switching element Q42, a switching controlling circuit that supplies an ON/OFF controlling signal to the commutating switching element Q42, and an inductor L4. The regeneration converters CONV5 and CONV6 each have a configuration similar to that of the regeneration converter CONV4. Each of the switching elements Q11, Q21, Q31, Q42, Q52, and Q62 is an FET including compound semiconductor, such as GaN (gallium nitride) and SiC (silicon carbide), or an IGBT (insulated gate bipolar transistor), and is a switching element that does not include a parasitic diode. Such an FET including the aforementioned compound semiconductor has a higher barrier against a voltage in a reverse direction than an FET including a Si semiconductor. Here, the reverse direction in an FET corresponds to a direction from the source to the drain. An FET formed of Si semiconductor includes a PN junction diode as a parasitic diode, and when a voltage is applied in a direction from the source to the drain is applied and the applied voltage exceeds a forward voltage of the PN junction diode, a current flows in a reverse direction through the PN junction diode. In a switching element that does not include a parasitic diode, a current does not flow in a reverse direction at a forward voltage of the PN junction diode, or in other words, a breakdown voltage relative to a voltage in a reverse direction is higher than the forward voltage of the PN junction diode. Therefore, a power supply device of a higher voltage can be formed.

Although not illustrated in FIG. 4A, the aforementioned switching controlling circuits are controlled by the amplitude change monitoring circuit.

The resonant frequency of the supply converter CONV1 is determined by the capacitance of the output capacitor Co and the inductance of the inductor L1. The resonant frequency of the supply converter CONV2 is determined by the capacitance of the output capacitor Co and the inductance of the inductor L2. In a similar manner, the resonant frequency of the supply converter CONV3 is determined by the capacitance of the output capacitor Co and the inductance of the inductor L3.

Each of the supply converters CONV1 through CONV3 supplies electric power in an amount equivalent to a half wave of the resonance to the load, and each of the regeneration converters CONV4 through CONV6 regenerates energy in an amount equivalent to a half wave of the resonance to the input side. These converters are resonant converters and thus undergo ZCS (zero current switching).

Although the supply converters and the regeneration converters are separated in the example illustrated in FIG. 4A, as illustrated in FIG. 4B, a bidirectional converter that includes both a rectifying element Qc and a commutating element Qr as switching elements may be provided to serve simultaneously as a supply converter and a regeneration converter.

Figure 5:
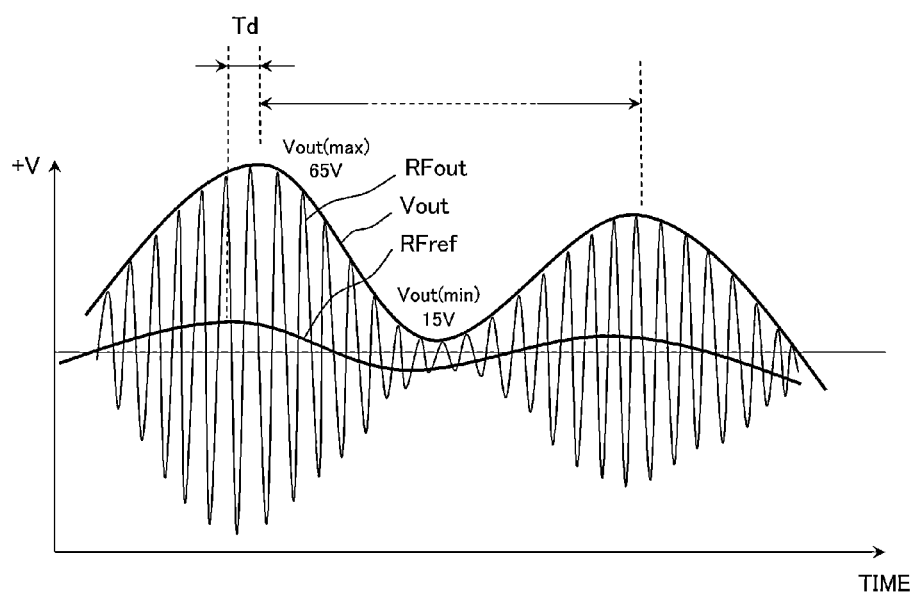
FIG. 5 illustrates a relationship between an amplitude change RFref (envelope) of an envelope of a high frequency signal and an envelope following output voltage Vout.

FIG. 5 illustrates a relationship between an amplitude change RFref (envelope) of the high frequency signal and the envelope following output voltage Vout. As each bidirectional converter supplies and/or regenerates energy, the envelope following output voltage Vout follows the envelope input signal RFref. In this example, a power supply voltage is applied to the high frequency power amplifying circuit 100 illustrated in FIG. 1 preferably at a maximum of about 65 V and at a minimum of about 15 V, for example. FIG. 5 illustrates an ideal state in which the difference between Vout and the envelope (see Ve in FIGS. 2A and 2B) of the high frequency power signal illustrated in FIGS. 2A and 2B becomes zero.

Due to the energy supplying and/or regenerating operations of the respective bidirectional converters and a delay in a response of the amplitude change monitoring circuit, etc., the envelope following output voltage Vout is delayed by a delay time Td relative to the envelope input signal RFref. This delay time Td needs to be, for example, no more than about 1 μs.

Figure 6A:
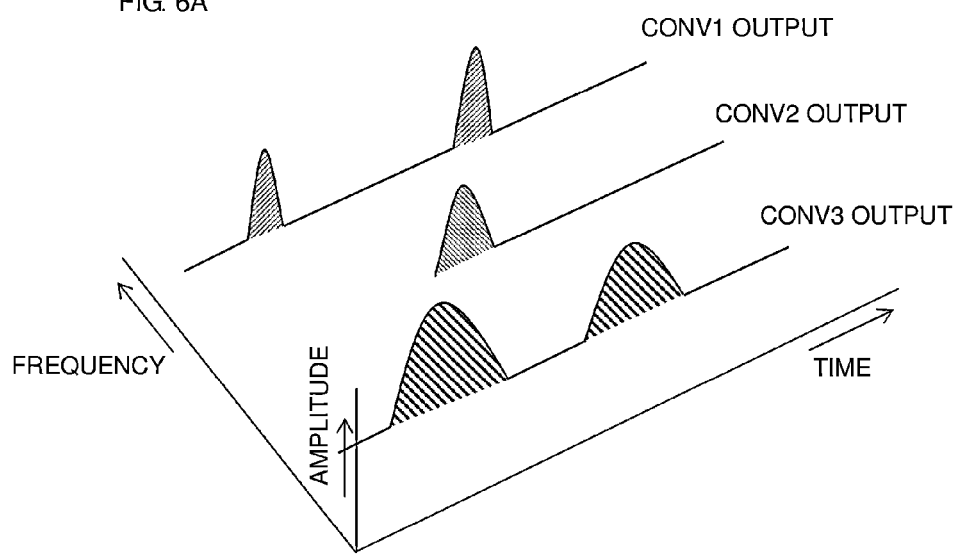
FIGS. 6A and 6B illustrate a relationship among outputs of a plurality of supply converters and power supplied to a load.
Figure 6B:
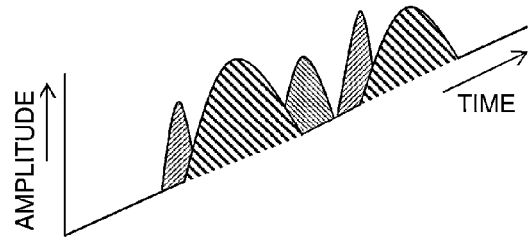

FIGS. 6A and 6B illustrate a relationship among outputs of a plurality of supply converters and power supplied to a load.

As illustrated in FIG. 6A, the outputs of the supply converters CONV1, CONV2, and CONV3 are combined, and the power having an envelope as illustrated in FIG. 6B is supplied to the load.

FIG. 7 illustrates a state in which an output voltage is made to follow an envelope input signal through the supply and/or regeneration of energy. The horizontal axis corresponds to a timing chart that indicates ON, OFF, and SLEEP timings of the supply converters CONV1, CONV2, and CONV3 and the regeneration converters CONV4, CONV5, and CONV6. In a supply converter, "ON" indicates an ON period of the rectifying element (high side element), and "OFF" indicates an OFF period of the rectifying element. In a regeneration converter, "ON" indicates an ON period of the commutating element (low side element), and "OFF" indicates an OFF period of the commutating element.

The converter switching circuit 11 (see FIG. 3) provides switching signals to the switching controlling circuits of the respective converters on the basis of the envelope input signal and in accordance with this timing chart. The output energy storage element (capacitance Co across output terminals) is charged and discharged through the supply and/or regeneration of an amount of electric charges in the respective converters, and thus the output voltage changes as illustrated in FIG. 7. It can be seen that this output voltage follows the input signal.

Figure 8:
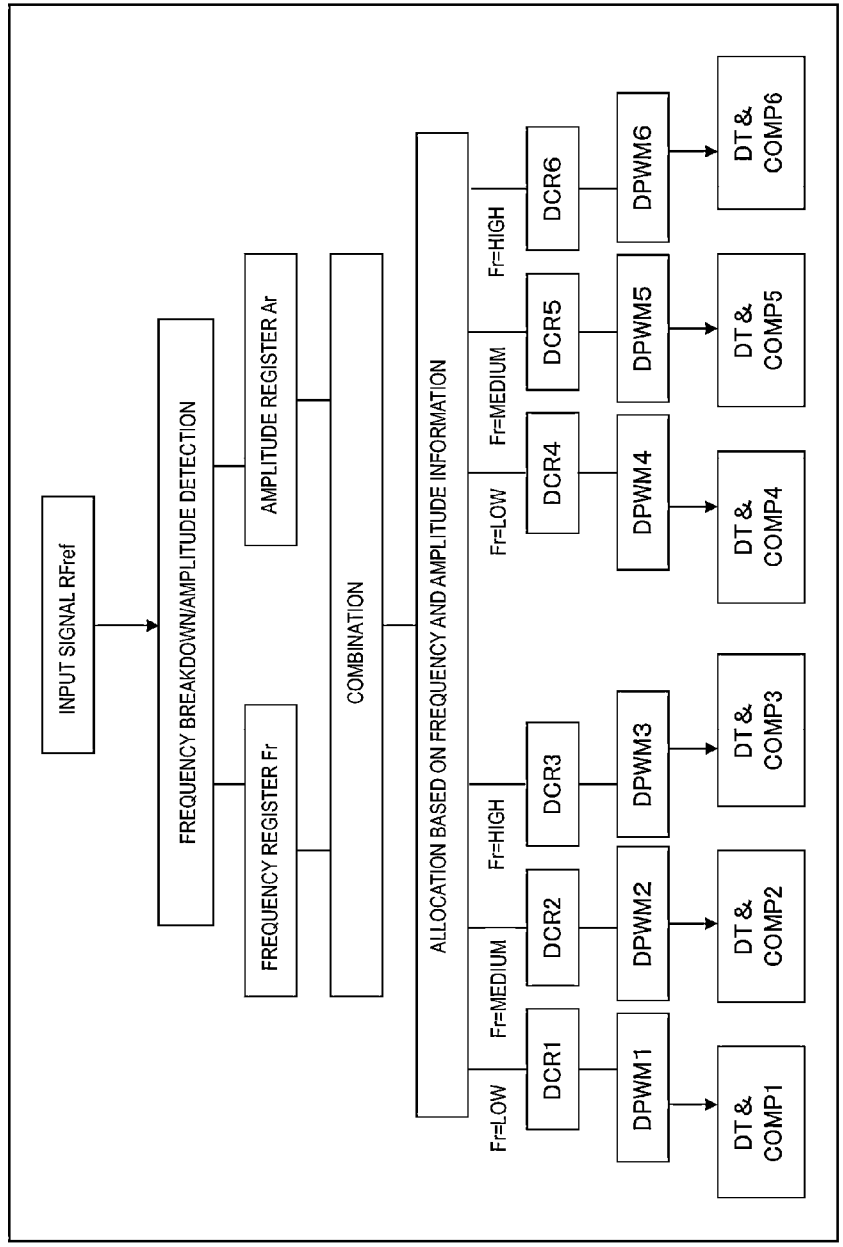
FIG. 8 illustrates processing through which an amplitude change monitoring circuit controls bidirectional converters by following an input signal in the power supply device 101 for a high frequency power amplifying circuit.

FIG. 8 illustrates processing through which the amplitude change monitoring circuit controls the bidirectional converters by following the envelope input signal in the power supply device 101 for a high frequency power amplifying circuit.

First, the envelope input signal RFref is subjected to a time frequency analysis, such as the wavelet transform, which is one of the frequency analysis methods, and information on the frequency and the signal amplitude is obtained. Then, the frequency information is inputted to a frequency register Fr, and the amplitude information is inputted to an amplitude register Ar. A single converter or a plurality of converters to be operated are configured on the basis of a combination of the values in the frequency register Fr and the amplitude register Ar. Depending on whether a given value in the frequency register Fr is small, medium, or large, the value is inputted to one of duty cycle registers DCR1, DCR2, and DCR3 for the supply converters and duty cycle registers DCR4, DCR5, and DCR6 for the regeneration converters.

Digital PWM circuits DPWM1 through DPWM6 output signals with an on-duty ratio in accordance with the values in the respective duty cycle registers DCR1 through DCR6. Dead time equipped complementary output generators DT&COMP1 through DT&COMP6 drive the rectifying switching elements and the commutating switching elements of the bidirectional converters in accordance with the output signals of the respective digital PWM circuits DPWM1 through DPWM6.

Through the feed-forward control described above, an output voltage (power) that is in accordance with the envelope input signal RFref is supplied to the load.

Second Preferred Embodiment

Figure 9:
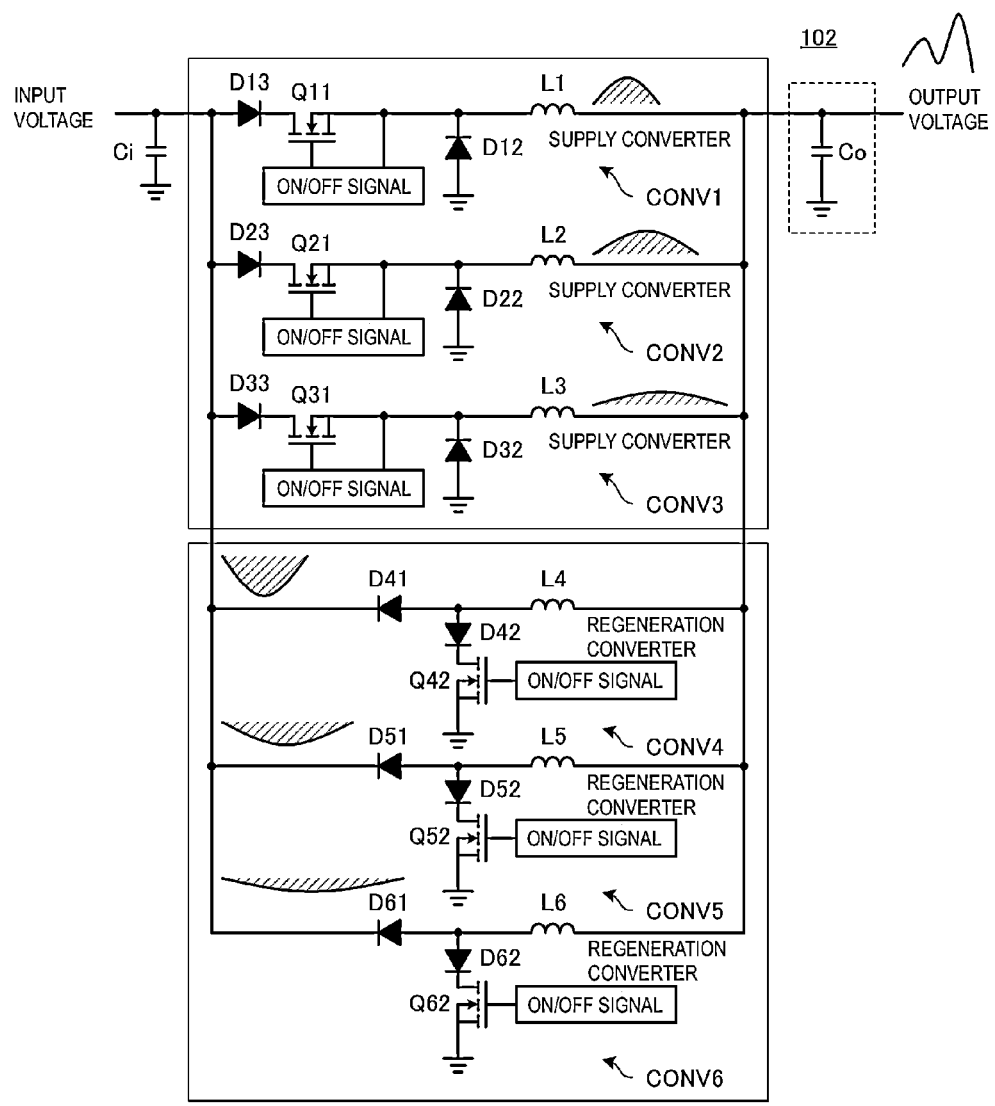
FIG. 9 is a block diagram illustrating a configuration of a power supply device 102 for a high frequency power amplifying circuit according to a second preferred embodiment of the present invention.

FIG. 9 is a block diagram illustrating a configuration of a power supply device 102 for a high frequency power amplifying circuit according to a second preferred embodiment of the present invention. Unlike the power supply device for a high frequency power amplifying circuit according to the first preferred embodiment illustrated in FIGS. 4A and 4B, the bidirectional converters each include a reverse current preventing element that is connected in series to a main switching element of the bidirectional converter so that a half wave of a current resonance waveform is supplied and/or regenerated. Specifically, diodes D13, D23, and D33 are connected in series, respectively, to rectifying switching elements Q11, Q21, and Q31 of the supply converters CONV1, CONV2, and CONV3. In addition, diodes D42, D52, and D62 are connected in series, respectively, to commutating switching elements Q42, Q52, and Q62 of the regeneration converters CONV4, CONV5, and CONV6.

Each of the switching elements Q11, Q21, Q31, Q42, Q52, and Q62 preferably is an FET including Si semiconductor and includes a parasitic diode.

In a case in which the aforementioned reverse current preventing diodes are not provided, a current resonance flows in a full wave due to the parasitic diodes of the FETs (rectifying switching elements Q11, Q21, and Q31 and commutating switching elements Q42, Q52, and Q62), and thus unnecessary energy circulation occurs.

According to the second preferred embodiment, as the diodes D13, D23, D33, D42, D52, and D62 are provided, a current flows in a half wave during both the supply operation and the regeneration operation of the converters, and thus unnecessary energy circulation is prevented.

Third Preferred Embodiment

Figure 10:
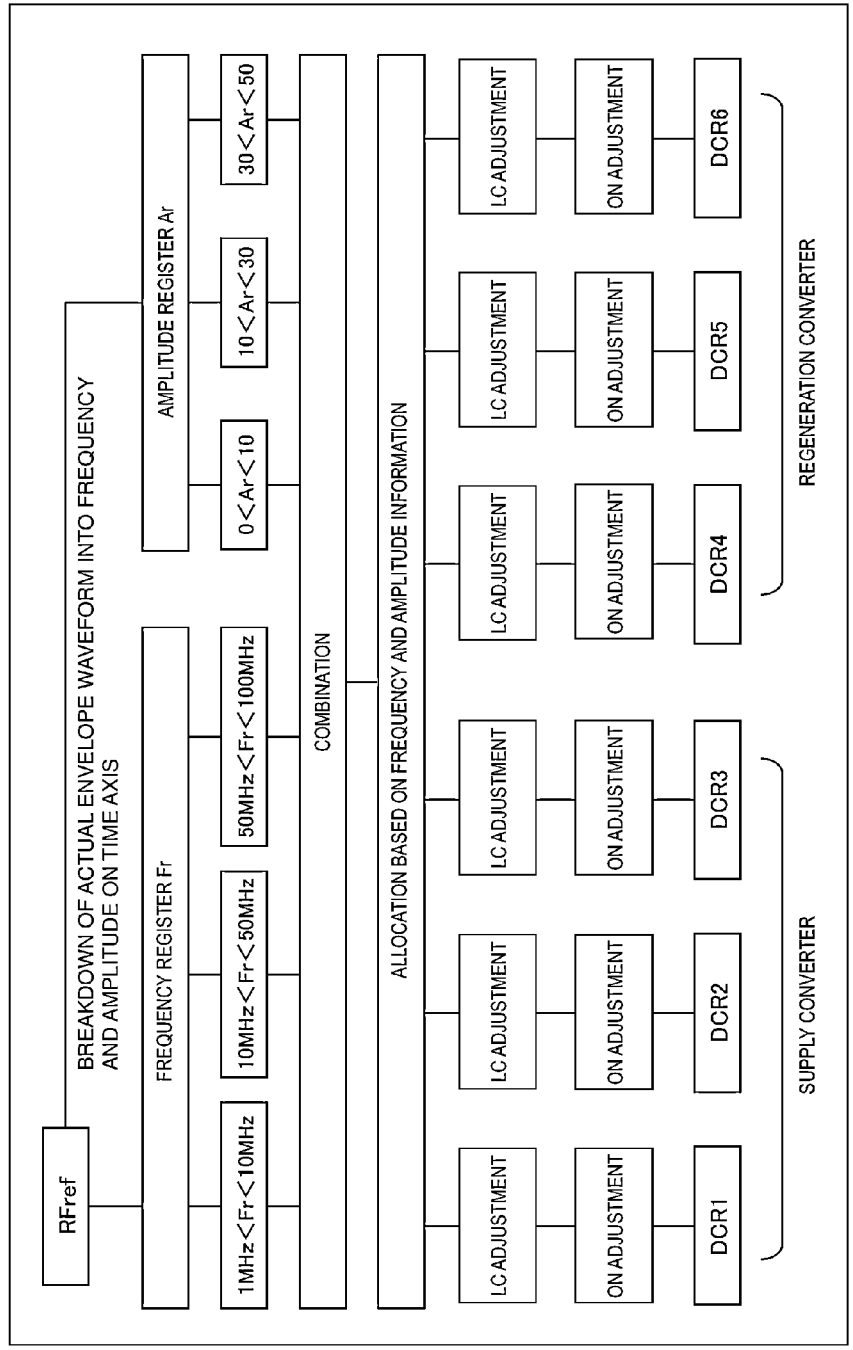
FIG. 10 illustrates an example of processing for allocating converters on the basis of frequencies and amplitudes.

FIG. 10 illustrates an example of processing for allocating converters on the basis of frequency information and amplitude information. In this processing, the envelope input signal RFref is broken down into frequency information and amplitude information on a time axis, and the frequency information and the amplitude information are inputted to the frequency register $F_r$ and the amplitude register Ar, respectively. Then, a value of a duty cycle register DCR is determined for each of the converters in accordance with the frequency range and the amplitude range.

In this example, it is determined in which one of the range of 1 MHz<Fr<10 MHz, the range of 10 MHz<Fr<50 MHz, and the range of 50 MHz<Fr<100 MHz the value of the frequency register Fr falls. In addition, it is determined in which one of the range of 0<Ar<10, the range of 10<Ar<30, and the range of 30<Ar<50 the value of the amplitude register Ar falls. In accordance with combinations of the frequencies and the amplitudes, the resonant frequencies and the ON times of the supply converters CONV1, CONV2, and CONV3 and the regeneration converters CONV4, CONV5, and CONV6 are set (allocated). In other words, an LC adjustment is made in accordance with a frequency range, and an ON adjustment is made in accordance with an amplitude range. In this manner, the values of the duty cycle registers DCR1 through DCR6 of the respective converters are determined. The converters output signals having on times that correspond to the values of the respective duty cycle registers DCR1 through DCR6.

Figure 11:
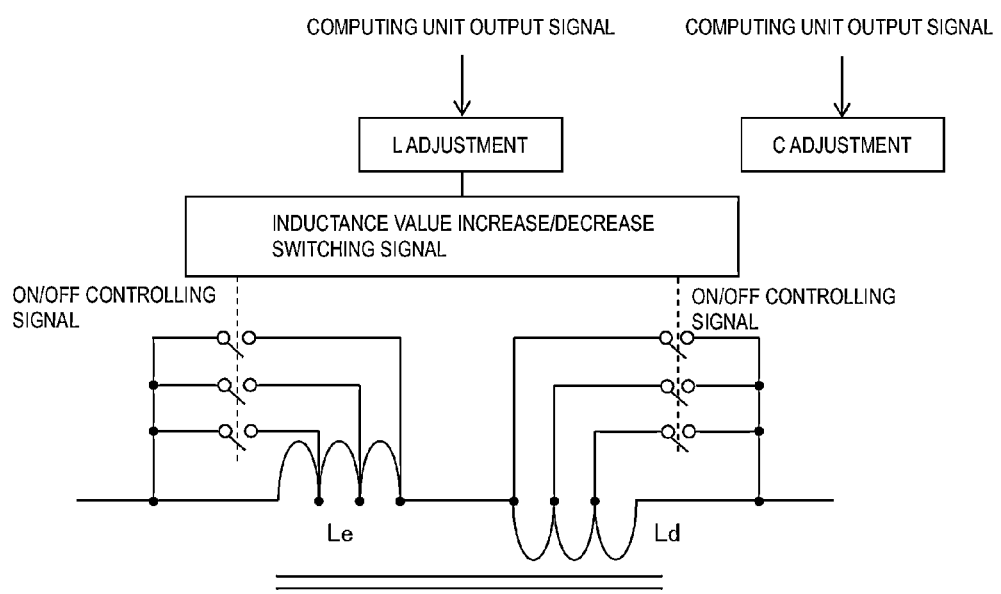
FIG. 11 illustrates an example in which a resonant frequency is changed in accordance with an inductance value.

FIG. 11 illustrates an example in which the resonant frequency is changed in accordance with an inductance value. A value (inductance value to be increased or decreased) inputted to an L adjusting register by a computing unit (converter switching circuit in the example illustrated in FIG. 3) is read out, and the inductance value of a variable inductor is adjusted in accordance with the aforementioned value. Specifically, a tap for a magnetizing coil Le and a tap for a demagnetizing coil Ld are switched. In a case in which such switching is made for the capacitance, a value (capacitance value to be increased or decreased) inputted to a C adjusting register by the computing unit is read out, and the capacitance value of a variable capacitor is controlled in accordance with the aforementioned value. The variable capacitor is implemented by a capacitor of which the capacitance value changes in accordance with a control voltage, or by combining a plurality of capacitors and switching among these capacitors.

The aforementioned coil may be implemented through various modes including a core-equipped coil, an air-core coil, and a printed board coil wired on a board.

Figure 12:
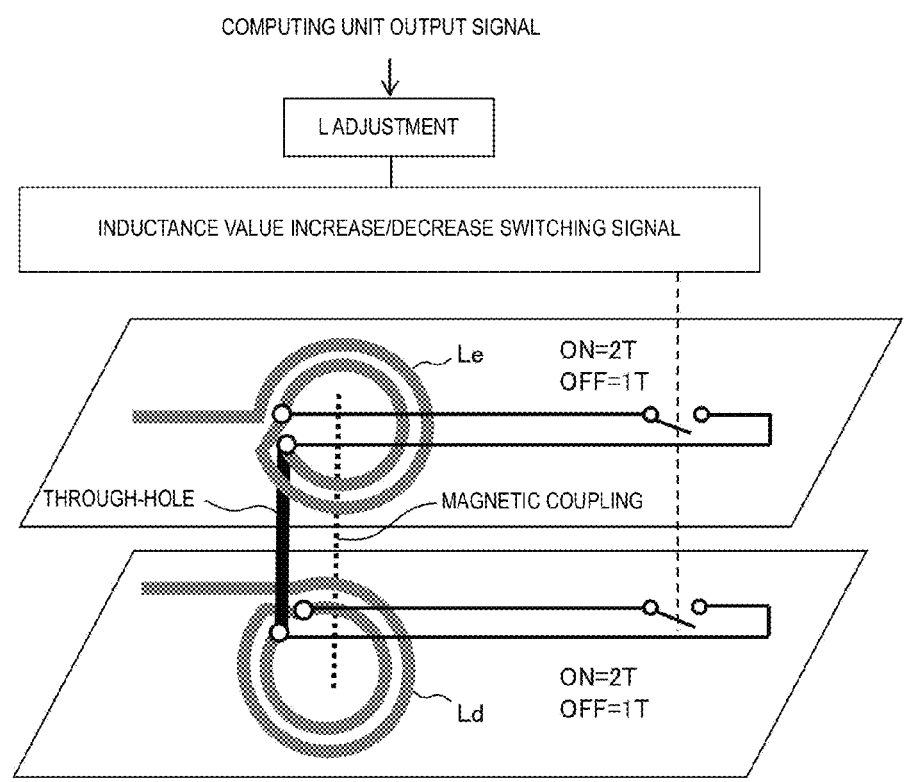
FIG. 12 illustrates an example in which a variable inductor is defined by a multilayer printed board coil.

FIG. 12 illustrates an example in which the variable inductor is preferably defined by a multilayer printed board coil, for example. The magnetizing coil Le is provided on a first layer of the multilayer printed board, and the demagnetizing coil Ld is formed on a second layer. When a switch connected to the magnetizing coil Le is off, the number of turns of the magnetizing coil Le is two. Meanwhile, when the switch is turned on, the number of turns of the magnetizing coil Le becomes one. In a similar manner, when a switch connected to the demagnetizing coil Ld is off, the number of turns of the demagnetizing coil Ld is two. Meanwhile, when the switch is turned on, the number of turns of the demagnetizing coil Ld becomes one. In this manner, a variable inductor of which the inductance is capable of being increased or decreased is preferably provided.

As the power supply device for a high frequency power amplifying circuit is provided with a function of adjusting the current resonant frequency of the converters as in this preferred embodiment, a small number of converters can be used as a converter of a predetermined resonant frequency. Accordingly, the input signal waveform and the output voltage waveform are kept similar to each other with a small number of converters.

Fourth Preferred Embodiment

Figure 13:
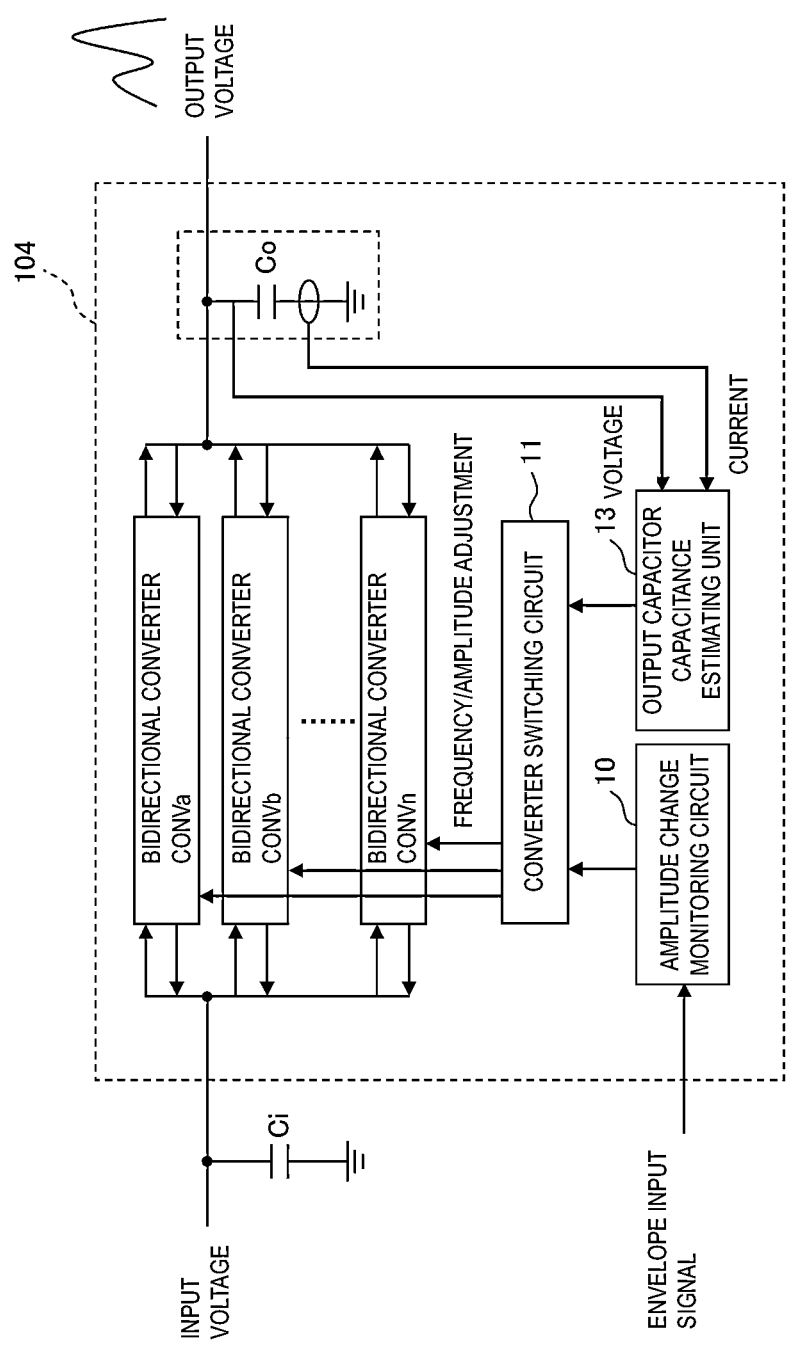
FIG. 13 is a block diagram illustrating a configuration of a power supply device 104 for a high frequency power amplifying circuit according to a fourth preferred embodiment of the present invention.

FIG. 13 is a block diagram illustrating a configuration of a power supply device 104 for a high frequency power amplifying circuit according to a fourth preferred embodiment of the present invention. The plurality of bidirectional converters CONVa, CONVb, . . . , CONVn that are each capable of supplying and/or regenerating energy are provided between the input section of the input voltage and the output section of the output voltage. The amplitude change monitoring circuit 10 receives, as an input, an input signal, which is an amplitude change signal of a high frequency signal. The amplitude change monitoring circuit 10 controls the supply and/or regeneration of energy in the bidirectional converters CONVa, CONVb, . . . , CONVn such that the output voltage follows the amplitude change of the high frequency signal. The converter switching circuit 11 switches between a period in which energy is supplied and a period in which energy is regenerated in an amount required by the load on the basis of the input signal. In other words, the converter switching circuit 11 switches among the plurality of bidirectional converters so as to set which converters carry out a supply operation or a regeneration operation. Furthermore, an output capacitor capacitance estimating unit 13 is provided and configured to estimate the capacitance of the output capacitor Co, which is the output energy storing element. The output capacitor capacitance estimating unit 13 receives the voltage and the current of the capacitor Co as an input and estimates the capacitance of the capacitor Co. The capacitance value C of the output capacitor Co is calculated through $C=\Delta Qout/\Delta Vout$, in which $\Delta Vout$ indicates the amount of change in the voltage and $\Delta Qout$ indicates the amount of transferred electric charge. This calculation executing unit is realized through an integrated circuit provided with a calculation function (CPU, DSP, FPGA, CPLD, etc.).

The converter switching circuit 11 switches between a period in which energy is supplied and a period in which energy is regenerated in each of the bidirectional converters on the basis of the envelope input signal inputted by the amplitude change monitoring circuit 10 and the estimated capacitance of the capacitor Co. Through this, the output voltage is controlled by controlling the amount of transferred electric charges of the output capacitor Co. The output capacitor Co is used as part of the LC resonance, and thus a variation in the capacitance value of the output capacitor becomes an issue. In this preferred embodiment, however, as the capacitance of the output capacitor is estimated, feed-forward control that is based on the envelope input signal as well as feedback control of the capacitance value estimated from the voltage and the current of the output capacitor Co are carried out. Thus, the precision in setting the resonant frequency is enhanced, and the similarity between the input signal and the output voltage is increased.

Figure 14:
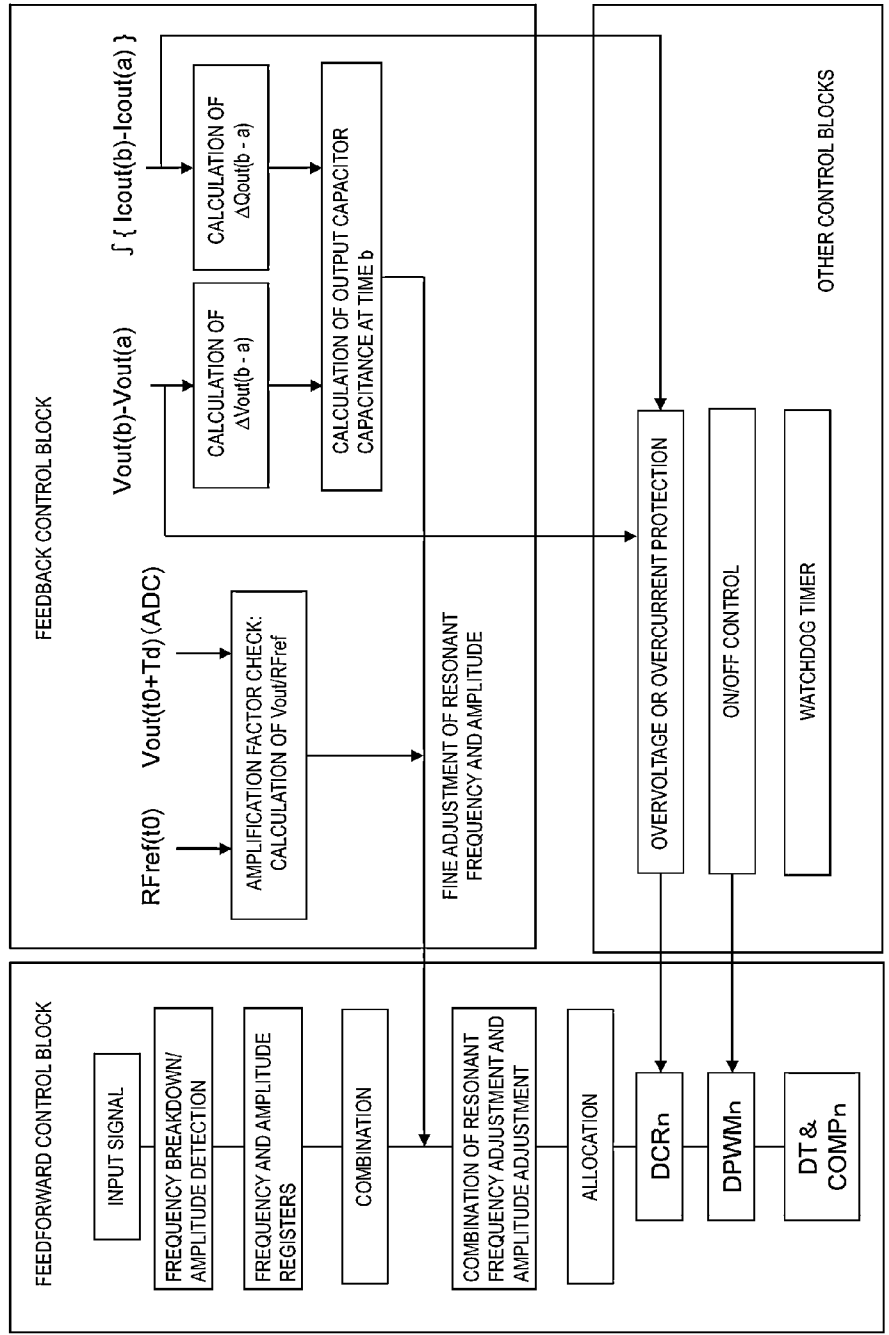
FIG. 14 illustrates processing content of feedback control and other control blocks.

FIG. 14 illustrates processing content of feedback control and other control blocks. The "feed-forward control block" illustrated in FIG. 14 is a simplified version of the configuration illustrated in FIG. 8 or FIG. 10. In the "feedback control block" illustrated in FIG. 14, an amplification factor Vout/RFref is obtained on the basis of the amplitude change $\Delta RFref$ (t0) of an input signal at a time t0 and the output voltage Vout(t0+Td) after the delay time Td. Then, amounts of the resonant frequency and the amplitude to be adjusted for making a fine adjustment to a deviation of the amplification factor Vout/RFref relative to a designed amplification factor are obtained accordingly. Thus, a fine adjustment is made to a value obtained through the "combination of the resonant frequency adjustment and the amplitude adjustment" in the feed-forward control block.

Furthermore, in the "feedback control block," a difference $\Delta Vout(b-a)$ between Vout(a) at a previous timing and Vout(b) at a current timing is calculated, and a time-integrated value $\Delta Qout(b-a)$ of a difference between a current Icout(a) that has flowed in the output capacitor at the previous timing and Icout(b) at the current timing is calculated. Then, the capacitance of the output capacitor at the time b is calculated, and amounts of the resonant frequency and the amplitude to be adjusted to make a fine adjustment to a deviation in the capacitance relative to a designed capacitance are obtained. Thus, a fine adjustment is made to a value used in the "combination of the resonant frequency adjustment and the amplitude adjustment" in the feed-forward control block.

In the "other control blocks," the on-duty ratio of the duty cycle register DCRn is regulated when Vout exceeds a predetermined upper limit value or when Icout exceeds a predetermined upper limit value. Through this, overvoltage protection or overcurrent protection is carried out. In addition, the digital PWM circuit DPWMn is forcibly turned OFF (on-duty 0) in accordance with a forced ON/OFF signal provided from the outside. Furthermore, if an alarm timer expires, an alarm is outputted to the outside.

The digital PWM circuits DPWMn (DPWM1 through DPWM6) output signals with an on-duty ratio in accordance with the values in the respective duty cycle registers DCRn (DCR1 through DCR6). The dead time equipped complementary output generators DT&COMPn (DT&COMP1 through DT&COMP6) drive the rectifying switching elements and the commutating switching elements of the bidirectional converters in accordance with the output signals of the digital PWM circuits DPWM1 through DPWM6.

Figure 15:
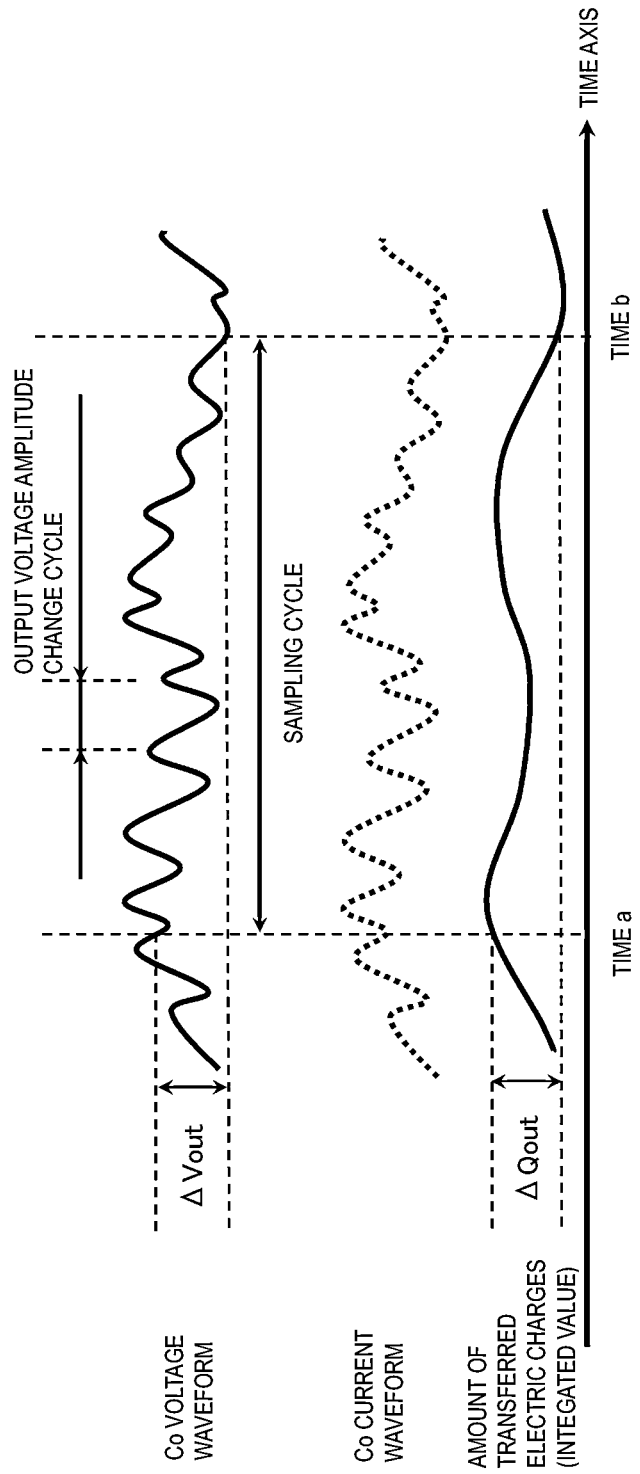
FIG. 15 illustrates an exemplary sampling timing for estimating the capacitance of an output capacitor in the power supply device for a high frequency power amplifying circuit according to the fourth preferred embodiment of the present invention.

FIG. 15 illustrates an exemplary sampling timing to estimate the capacitance of the output capacitor in the power supply device for a high frequency power amplifying circuit according to the fourth preferred embodiment. When the voltage and the current of the output capacitor Co are processed in digital values, the voltage and the current are sampled at a frequency that is higher than the frequency of the amplitude change of the output voltage in some cases, or sampled at a frequency that is lower than the frequency of the amplitude change of the output voltage in other cases. When sampling at a lower frequency, the sampling frequency is reduced, and the capacitance of the output capacitor Co is estimated from data across two points.

In this manner, even if the sampling frequency is lower than the signal frequency, the capacitance of the output capacitor Co is calculated on the basis of the aforementioned ΔVout and ΔQout. Furthermore, by setting the sampling frequency to be lower than the signal frequency, a computation amount required to calculate the capacitance of the output capacitor Co per unit time is reduced.

Figure 16:
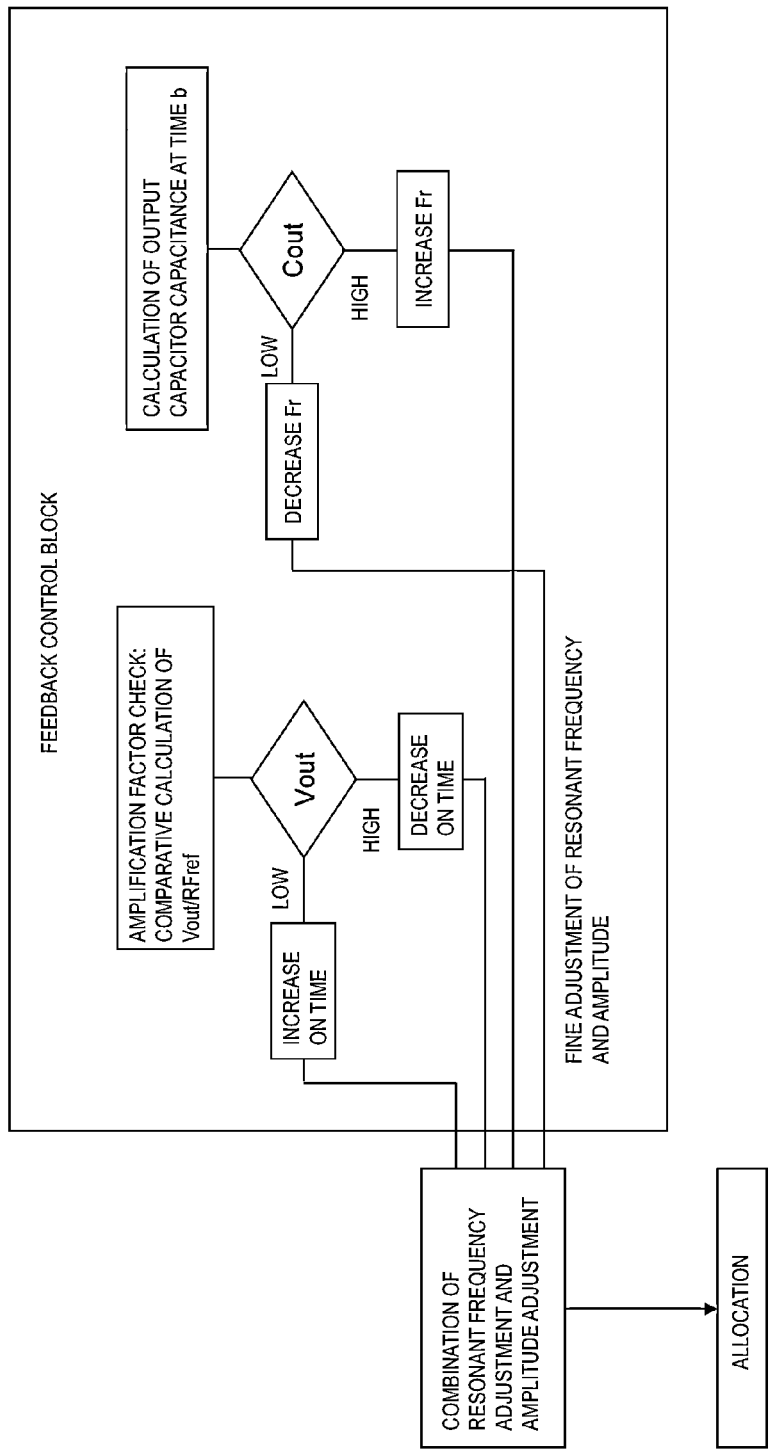
FIG. 16 illustrates content of processing for increasing or decreasing a necessary ON time and processing for increasing or decreasing a resonant frequency, including a fine adjustment by a feedback control block.

FIG. 16 illustrates content of necessary processing to increase or decrease an ON time and necessary processing to increase or decrease the resonant frequency including the fine adjustment by the feedback control block. The output voltage Vout is compared with the amplitude change RFref of the envelope signal. If the output voltage Vout is lower, the ON time is increased by a predetermined amount, and if the output voltage Vout is higher, the ON time is decreased by a predetermined amount. In addition, if the capacitance Cout of the output capacitor Co at the time b is lower than a design value, the resonant frequency Fr is decreased by a predetermined amount, and if the capacitance Cout is higher than the design value, the resonant frequency Fr is increased by a predetermined amount.

Fifth Preferred Embodiment

Figure 17:
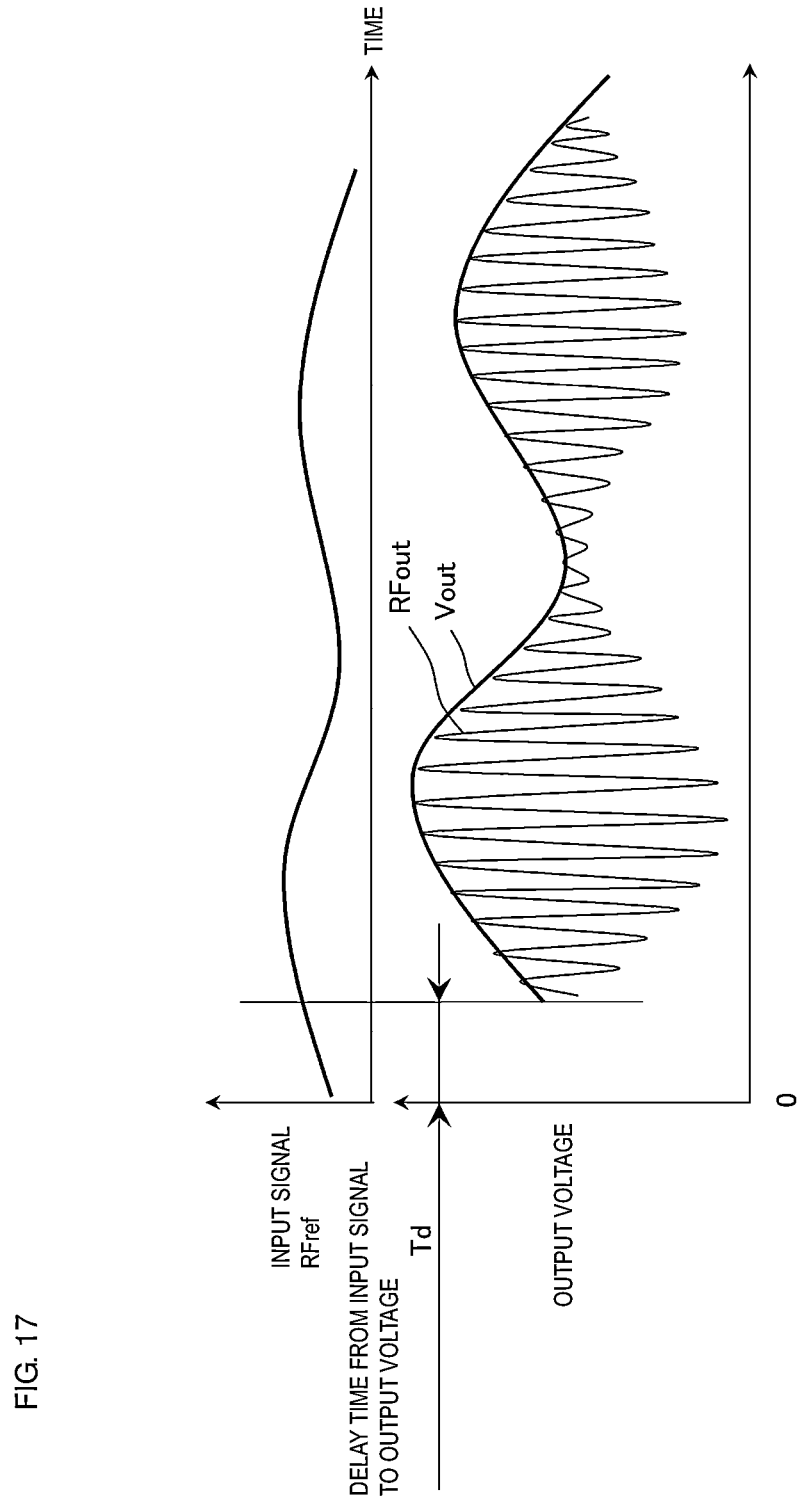
FIG. 17 illustrates a relationship among an input signal, a high frequency signal, and an output voltage.

FIG. 17 illustrates a relationship among the input signal, the high frequency signal, and the output voltage. Here, high frequency components of the output voltage correspond to switching frequency components of the respective bidirectional converters, and the output voltage is made to follow the envelope input signal RFref through the supply and/or regeneration of energy in each of the bidirectional converters.

Due to the energy supplying and/or regenerating operation in each of the bidirectional converters and a delay in a response of the amplitude change monitoring circuit, the envelope following output voltage Vout is delayed by the delay time Td relative to the input signal (envelope input signal RFref).

A power supply device for a high frequency power amplifying circuit and a high frequency power amplifying apparatus according to a fifth preferred embodiment of the present invention make a correction in an amount equivalent to the delay time Td.

Figure 18:
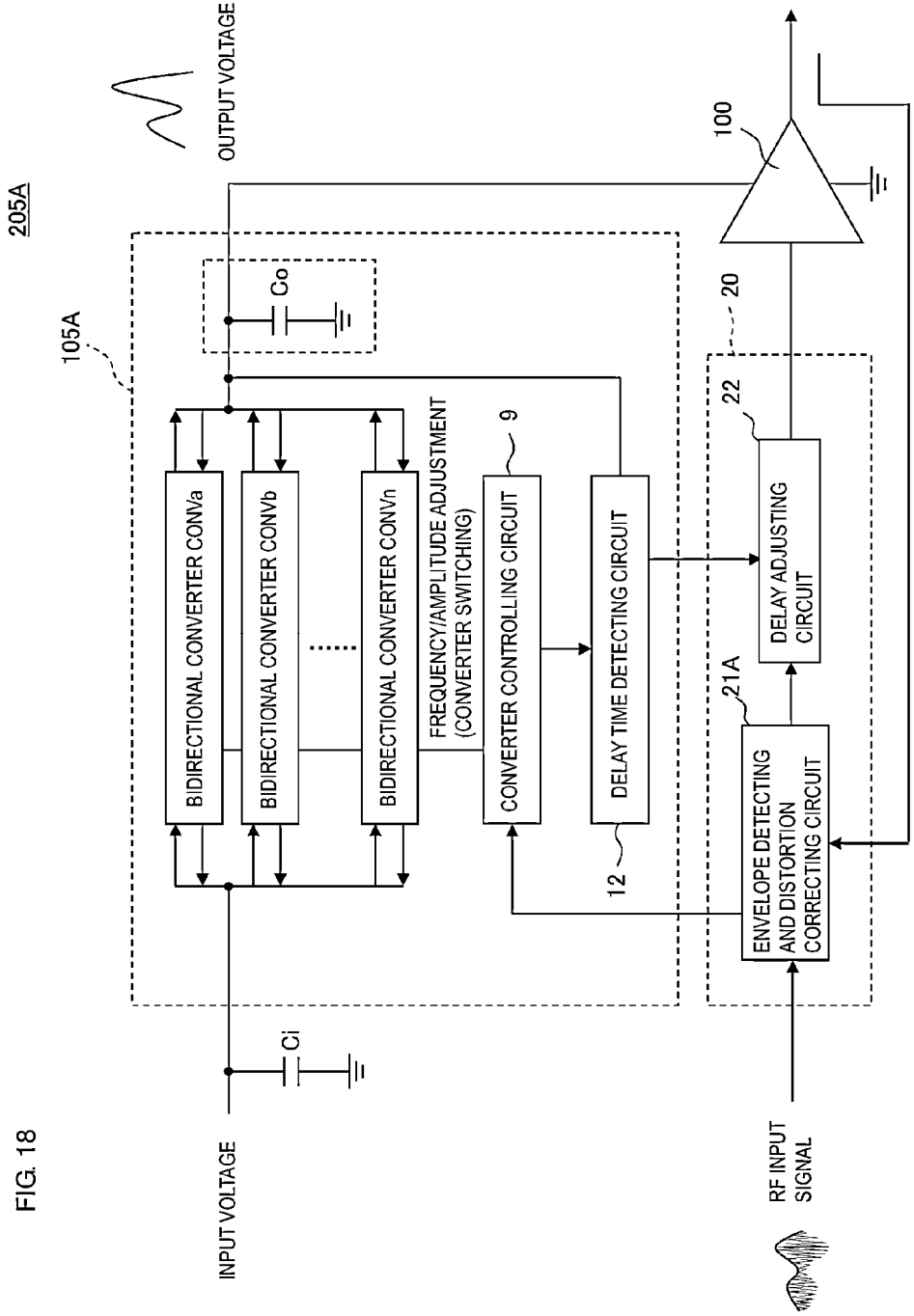
FIG. 18 is a block diagram illustrating a configuration of a power supply device 105A for a high frequency power amplifying circuit and a configuration of a high frequency power amplifying apparatus 205A according to a fifth preferred embodiment of the present invention.

FIG. 18 is a block diagram illustrating a configuration of a power supply device 105A for a high frequency power amplifying circuit and a configuration of a high frequency power amplifying apparatus 205A according to the fifth preferred embodiment of the present invention. The high frequency power amplifying apparatus 205A includes the power supply device 105A for a high frequency power amplifying circuit, an RF signal processing circuit 20, and the high frequency power amplifying circuit 100.

The plurality of bidirectional converters CONVa, CONVb, . . . , CONVn are provided between the input section of the input voltage and the output section of the output voltage. Each of the bidirectional converters is configured to supply and/or regenerate energy. A converter controlling circuit 9 receives, as an input, an envelope signal outputted from an envelope detecting and distortion correcting circuit 21A. The converter controlling circuit 9 controls the supply and/or regeneration of energy in the bidirectional converters CONVa, CONVb, . . . , CONVn such that the output voltage follows the amplitude change of the high frequency signal. A delay time detecting circuit 12 compares an envelope signal detected by the converter controlling circuit 9 with an output voltage signal so as to detect a delay time.

The envelope detecting and distortion correcting circuit 21A feeds back a signal that has been split from an output signal of the high frequency power amplifying circuit 100 to an RF input signal so as to correct a distortion. A delay adjusting circuit 22 receives, as an input, a signal that corresponds to the delay time detected by the delay time detecting circuit 12. The delay adjusting circuit 22 then delays the output signal of the distortion correcting circuit 21A and outputs the result to the high frequency power amplifying circuit 100.

In this manner, the RF input signal is delayed by a period equivalent to the delay time of the power supply device 105A for a high frequency power amplifying circuit and is outputted to the high frequency power amplifying circuit 100. Thus, a power supply voltage that follows a signal to be amplified by the high frequency power amplifying circuit 100 is applied.

Figure 19:
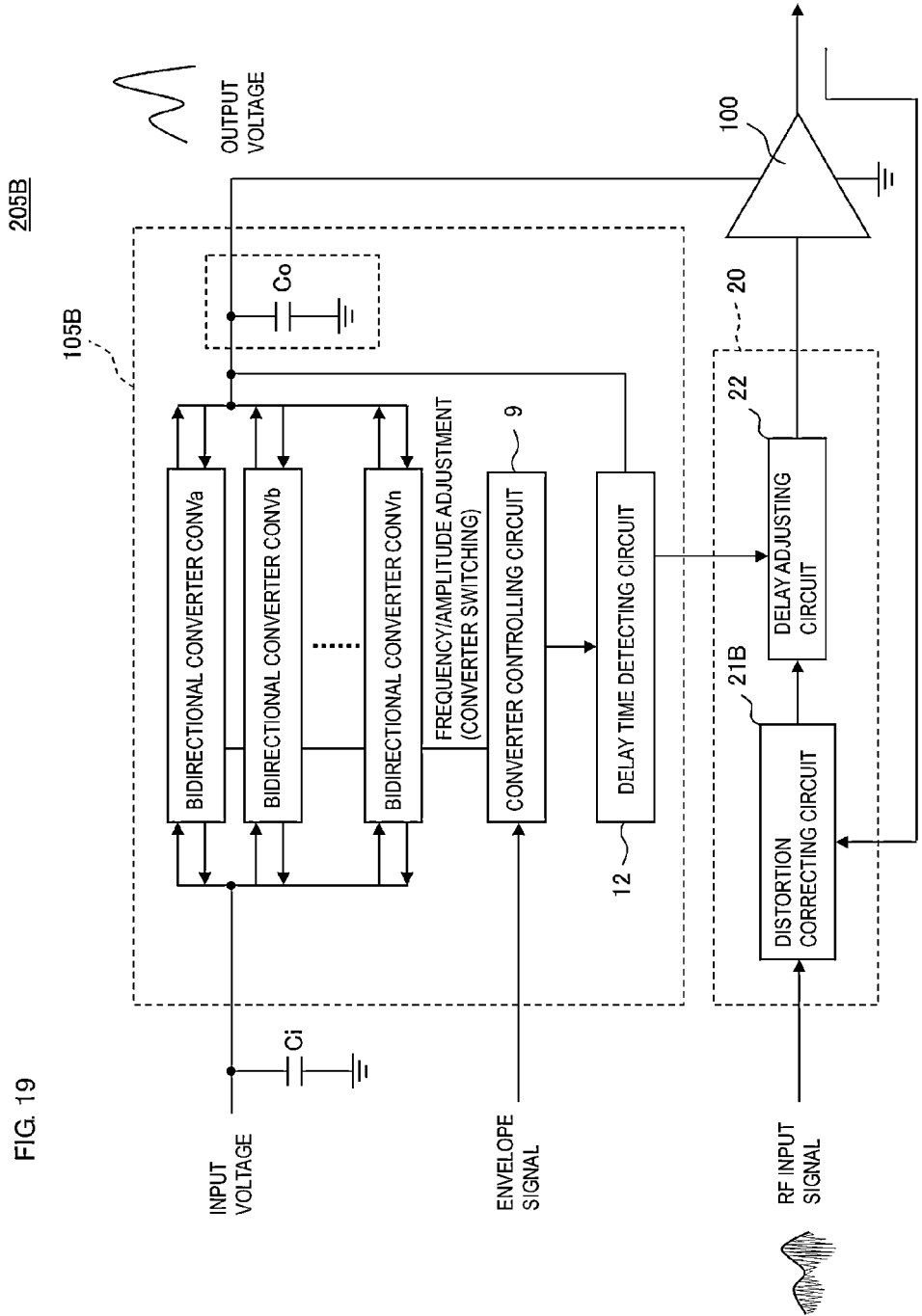
FIG. 19 is a block diagram illustrating a configuration of a power supply device 105B for a high frequency power amplifying circuit and a configuration of a high frequency power amplifying apparatus 205B according to the fifth preferred embodiment of the present invention.

FIG. 19 is a block diagram illustrating a configuration of a power supply device 105B for a high frequency power amplifying circuit and a configuration of a high frequency power amplifying apparatus 205B according to a modification of the fifth preferred embodiment of the present invention. The power supply device 105B differs from the power supply device 105A for a high frequency power amplifying circuit in that an envelope signal is inputted to the converter controlling circuit 9 from the outside, and the power supply devices 105A and 105B are identical in other respects. Even with such a configuration, an RF input signal is capable of being delayed by a period equivalent to the delay time of the power supply device 105B for a high frequency power amplifying circuit and is outputted to the high frequency power amplifying circuit 100. The aforementioned envelope signal inputted from the outside corresponds to a signal obtained by extracting a square root of added the squares of signal intensities of two, I and Q, modulation signals of an orthogonal modulation circuit. In other words, the envelope signal is obtained from I and Q digital signals through a calculation, and the calculated digital signal is extracted in the form of an analog signal through a DA converter.

Sixth Preferred Embodiment

Figure 20A:
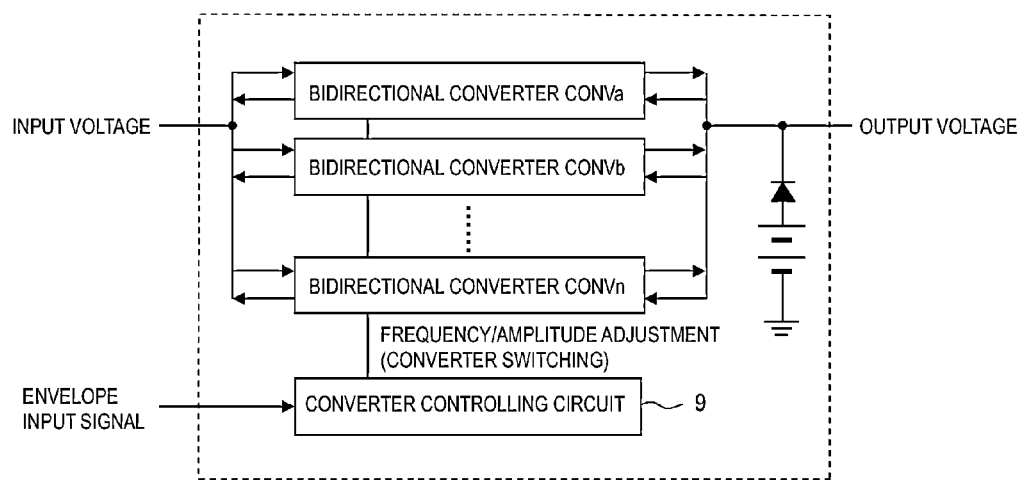
FIG. 20A is a block diagram illustrating a configuration of a power supply device 106A for a high frequency power amplifying circuit according to a sixth preferred embodiment of the present invention.
Figure 20B:
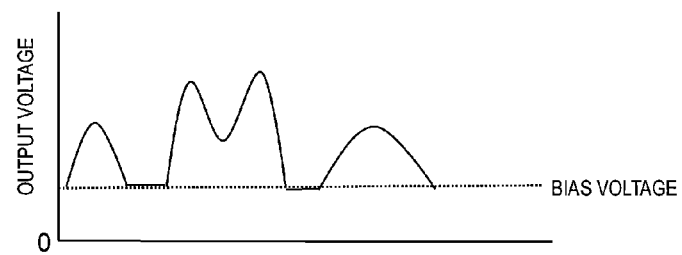
FIG. 20B is a waveform diagram of an output voltage of the power supply device 106A for a high frequency power amplifying circuit.

FIG. 20A is a block diagram illustrating a configuration of a power supply device 106A for a high frequency power amplifying circuit according to a sixth preferred embodiment of the present invention. FIG. 20B is a waveform diagram of an output voltage of the power supply device 106A for a high frequency power amplifying circuit.

As illustrated in FIG. 20A, the power supply device 106A for a high frequency power amplifying circuit includes a bias voltage superposing circuit provided at the output section of the bidirectional converters CONVa through CONVn. The bias voltage superposing circuit generates a direct current bias voltage and superposes the direct current bias voltage onto an output of the plurality of bidirectional converters CONVa through CONVn. The circuit that generates the direct current bias voltage is preferably constituted by a single bidirectional converter or by a plurality of bidirectional converters, for example. Alternatively, the direct current bias voltage is supplied from a voltage stabilizing circuit provided at a stage preceding the input section of the input voltage.

As illustrated in FIG. 20B, the output voltage takes a value that constantly exceeds the direct current bias voltage and follows the envelope input signal within the range exceeding this bias voltage. Through this configuration, the range in which the output voltage varies is made narrower, and the control range is limited, improving the control performance. In addition, a variation in the output voltage is significantly reduced or prevented, and thus the cumulative amount of supplied or regenerated energy decreases, making it possible to reduce a loss.

Figure 21A:
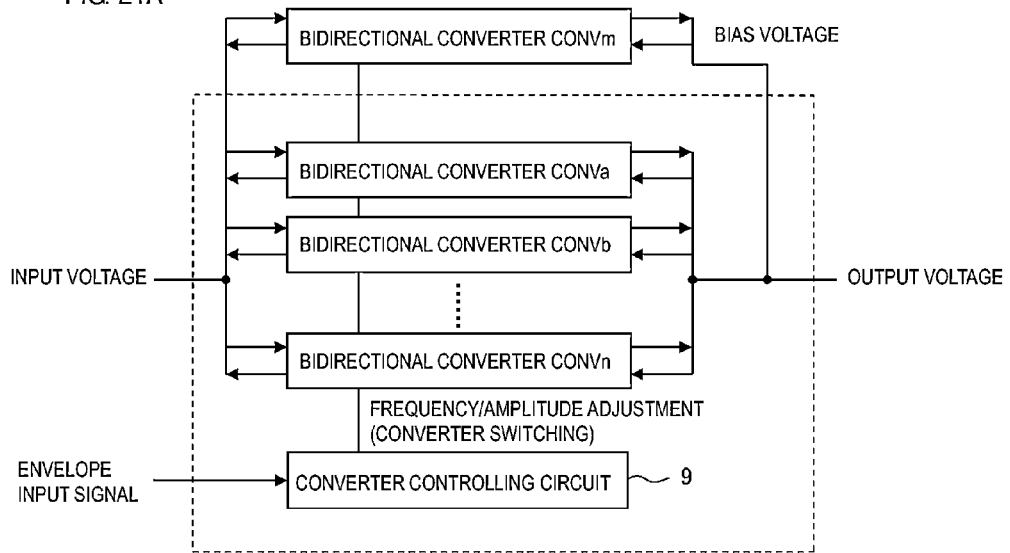
FIG. 21A is a block diagram illustrating a configuration of a power supply device 106B for a high frequency power amplifying circuit according to the sixth preferred embodiment of the present invention.
Figure 21B:
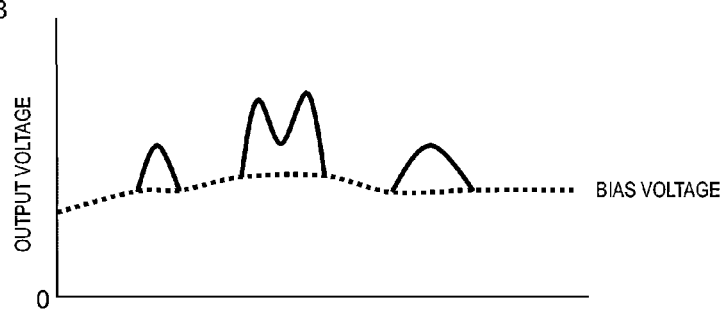
FIG. 21B is a waveform diagram of an output voltage of the power supply device 106B for a high frequency power amplifying circuit.
Figure 22:
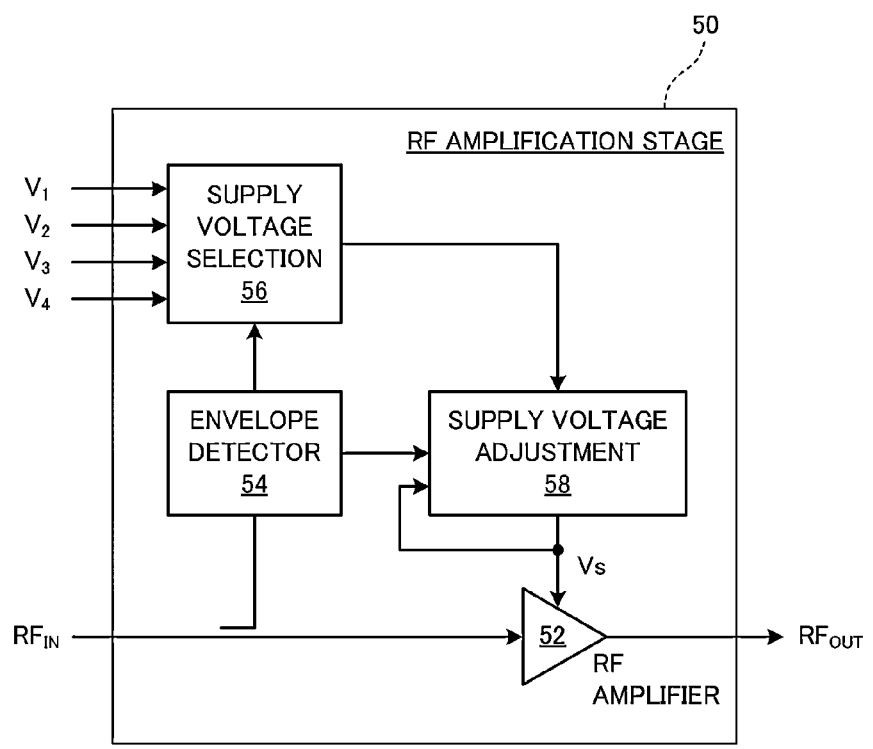
FIG. 22 is a block diagram of a high frequency power amplifying circuit 50 described in Japanese Unexamined Patent Application Publication No. 2006-514472.

FIG. 21A is a block diagram illustrating a configuration of a power supply device 106B for a high frequency power amplifying circuit according to the sixth preferred embodiment of the present invention. The power supply device 106B for a high frequency power amplifying circuit is a more detailed example of the power supply device for a high frequency power amplifying circuit illustrated in FIG. 20A. FIG. 21B is a waveform diagram of an output voltage of the power supply device 106B for a high frequency power amplifying circuit. In FIG. 21A, a bidirectional converter CONVm is provided at a stage preceding the input section of the input voltage and supplies a direct current bias voltage.

If the high frequency power amplifying circuit (load to which the output voltage is supplied) has a variable resistance property within an range that does not exceed the direct current bias voltage, the bidirectional converter CONVm, which generates the direct current bias voltage, is preferably in an operation mode in which its choke coil current flows continuously so that the output voltage is uniquely determined on the basis of the input voltage and the time ratio. Through this, the feed-forward control performance is improved. Furthermore, the direct current bias voltage is varied as necessary. Accordingly, the control performance further improves, and a variation in the output voltage is significantly reduced or prevented, making it possible to significantly reduce a loss.

Other Preferred Embodiments

In each of the preferred embodiments described above, the switching element of each of the converters preferably is subjected to the PWM control so as to control a transmission amount of energy while keeping the wavelength of a half wave constant. Alternatively, time control in which a sleep and a burst are combined may be carried out instead of the PWM control.

In addition, in each of the preferred embodiments described above, an example in which both a supply converter and a regeneration converter are preferably used has been illustrated. Alternatively, in a case in which necessary and sufficient similarity can be obtained with only a supply converter, a regeneration converter can be omitted.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power supply device for a high frequency power amplifying circuit, the power supply device being configured to vary an output voltage supplied as a power supply voltage to the high frequency power amplifying circuit that amplifies a high frequency signal, in accordance with an amplitude change of the high frequency signal, the power supply device comprising:
a plurality of bidirectional converters provided between an input section of an input voltage and an output section of the output voltage, the bidirectional converters being configured to include a plurality of frequencies of resonant currents that flow through the plurality of bidirectional converters, the plurality of bidirectional converters being configured to supply and/or regenerate energy;
an output side energy storing element provided at the output section of the plurality of bidirectional converters;
a time frequency analysis unit configured to convert an input signal of the high frequency power amplifying circuit to control information that includes frequency information and signal amplitude information on a time axis; and
a converter controlling circuit configured or programmed to detect an amplitude change of the high frequency signal and to control resonant frequencies and amplitudes of the plurality of bidirectional converters such that the output voltage follows the amplitude change of the high frequency signal.

2. The power supply device for the high frequency power amplifying circuit according to claim 1, further comprising a regenerated energy storing element provided at the input section of the plurality of bidirectional converters, the regenerated energy storing element being configured to store regenerated energy from the output side energy storing element.

3. The power supply device for the high frequency power amplifying circuit according to claim 1, wherein at least one of the plurality of bidirectional converters includes a reverse current preventing element that is connected in series to a main switching element of the at least one of the plurality of bidirectional converters so that a half wave of a current resonance waveform is supplied and/or regenerated.

4. The power supply device for the high frequency power amplifying circuit according to claim 2, wherein at least one of the plurality of bidirectional converters includes a reverse current preventing element that is connected in series to a main switching element of the at least one of the plurality of bidirectional converters so that a half wave of a current resonance waveform is supplied and/or regenerated.

5. The power supply device for the high frequency power amplifying circuit according to claim 1, wherein a main switching element of at least one of the plurality of bidirectional converters is a switching element that does not include a parasitic diode, and the main switching element has a breakdown voltage relative to a voltage in a reverse direction higher than a forward voltage of a PN junction diode.

6. The power supply device for the high frequency power amplifying circuit according to claim 2, wherein a main switching element of at least one of the plurality of bidirectional converters is a switching element that does not include a parasitic diode, and the main switching element has a breakdown voltage relative to a voltage in a reverse direction higher than a forward voltage of a PN junction diode.

7. The power supply device for the high frequency power amplifying circuit according to claim 3, wherein a main switching element of at least one of the plurality of bidirectional converters is a switching element that does not include a parasitic diode, and the main switching element has a breakdown voltage relative to a voltage in a reverse direction higher than a forward voltage of a PN junction diode.

8. The power supply device for the high frequency power amplifying circuit according to claim 4, wherein a main switching element of at least one of the plurality of bidirectional converters is a switching element that does not include a parasitic diode, and the main switching element has a breakdown voltage relative to a voltage in a reverse direction higher than a forward voltage of a PN junction diode.

9. The power supply device for the high frequency power amplifying circuit according to claim 1, wherein at least one of the plurality of bidirectional converters is a converter of which a current resonant frequency changes in accordance with an inductance of an inductor and a capacitance of a capacitor, and the converter controlling circuit controls the inductance of the inductor.

10. The power supply device for the high frequency power amplifying circuit according to claim 2, wherein at least one of the plurality of bidirectional converters is a converter of which a current resonant frequency changes in accordance with an inductance of an inductor and a capacitance of a capacitor, and the converter controlling circuit controls the inductance of the inductor.

11. The power supply device for the high frequency power amplifying circuit according to claim 3, wherein at least one of the plurality of bidirectional converters is a converter of which a current resonant frequency changes in accordance with an inductance of an inductor and a capacitance of a capacitor, and the converter controlling circuit controls the inductance of the inductor.

12. The power supply device for the high frequency power amplifying circuit according to claim 4, wherein at least one of the plurality of bidirectional converters is a converter of which a current resonant frequency changes in accordance with an inductance of an inductor and a capacitance of a capacitor, and the converter controlling circuit controls the inductance of the inductor.

13. The power supply device for the high frequency power amplifying circuit according to claim 9, wherein
the inductor includes a coil that is wound in a magnetizing direction and a demagnetizing direction; and
the converter controlling circuit is configured to switch the number of turns of the coil.

14. The power supply device for the high frequency power amplifying circuit according to claim 1, wherein at least one of the plurality of bidirectional converters is a converter of which a current resonant frequency changes in accordance with an inductance of an inductor and a capacitance of a capacitor, and the converter controlling circuit is configured to control the capacitance of the capacitor.

15. The power supply device for the high frequency power amplifying circuit according to claim 1, wherein the converter controlling circuit includes an output capacitance estimating unit configured to detect a voltage applied to and a current flowing in the output side energy storing element so as to estimate a capacitance of the output side energy storing element.

16. The power supply device for the high frequency power amplifying circuit according to claim 15, further comprising a unit configured to correct current resonant frequencies of the plurality of bidirectional converters based on information obtained from the output capacitance estimating unit.

17. The power supply device for the high frequency power amplifying circuit according to claim 1, further comprising a direct current bias voltage superposing unit configured to superpose a direct current bias voltage to the output section.

18. The power supply device for the high frequency power amplifying circuit according to claim 17, wherein the direct current bias voltage superposing unit includes a bidirectional converter and a controlling circuit configured to vary the bias voltage generated by the bidirectional converter on a time axis.

19. The power supply device for the high frequency power amplifying circuit according to claim 1, further comprising a delay time detecting circuit configured to detect a delay time of a change in the output voltage relative to the amplitude change of the high frequency signal, wherein the converter controlling circuit includes a delay adjusting circuit configured to delay the high frequency signal by the delay time.

20. A high frequency power amplifying apparatus that includes a high frequency power amplifying circuit configured to amplify a high frequency signal, and a power supply device for the high frequency power amplifying circuit, the power supply device being configured to vary an output voltage supplied as a power supply voltage to the high frequency power amplifying circuit, in accordance with an amplitude change of the high frequency signal, the high frequency power amplifying apparatus comprising:
a plurality of bidirectional converters provided between an input section of an input voltage and an output section of the output voltage, the plurality of bidirectional converters being configured to include a plurality of frequencies of resonant currents that flow through the plurality of bidirectional converters, the plurality of bidirectional converters being configured to supply and/or regenerate energy;
an output side energy storing element provided at the output section of the plurality of bidirectional converters;
a time frequency analysis unit configured to convert an envelope input signal of the high frequency power amplifying circuit to control information that includes frequency information and signal amplitude information; and
a converter controlling circuit configured to detect an amplitude change of the high frequency signal and to control resonant frequencies and amplitudes of the plurality of bidirectional converters such that the output voltage follows the amplitude change of the envelope input signal.

\* \* \* \* \*